US008363371B2

(12) United States Patent
Korrek

(10) Patent No.: US 8,363,371 B2
(45) Date of Patent: Jan. 29, 2013

(54) SAFETY SWITCHING DEVICE FOR SETTING A SAFETY-RELATED DEVICE TO A SAFE STATE

(75) Inventor: Andre Korrek, Marienmuenster (DE)

(73) Assignee: Phoenix Contact GmbH & Co. KG (DE)

( * ) Notice: Subject to any disclaimer, the term of this patent is extended or adjusted under 35 U.S.C. 154(b) by 1264 days.

(21) Appl. No.: 11/915,326

(22) PCT Filed: Jul. 28, 2006

(86) PCT No.: PCT/EP2006/007518
§ 371 (c)(1),
(2), (4) Date: May 6, 2008

(87) PCT Pub. No.: WO2007/014725
PCT Pub. Date: Feb. 8, 2007

(65) Prior Publication Data
US 2008/0225457 A1    Sep. 18, 2008

(30) Foreign Application Priority Data

Aug. 2, 2005 (DE) .......................... 10 2005 036 777
Sep. 23, 2005 (DE) .......................... 10 2005 045 753
Jan. 12, 2006 (DE) .......................... 10 2006 001 805

(51) Int. Cl.
*H02H 3/08* (2006.01)
*H02H 9/02* (2006.01)
(52) U.S. Cl. ..................................... 361/93.1
(58) Field of Classification Search .................... 361/88, 361/93.1, 115; 700/2–4
See application file for complete search history.

(56) References Cited

U.S. PATENT DOCUMENTS

| 4,625,283 A | 11/1986 | Hurley |
| 4,630,218 A | 12/1986 | Hurley |

(Continued)

FOREIGN PATENT DOCUMENTS

| CN | 1199173 A | 11/1998 |
| CN | 1588600 A | 3/2005 |

(Continued)

OTHER PUBLICATIONS

Y. Akao, "Japanese Patent Application No. 2008-524412 Examiner's Office Letter", Nov. 24, 2009, Publisher: JIPO, Published in: JP.

(Continued)

*Primary Examiner* — Rexford Barnie
*Assistant Examiner* — Christopher Clark
(74) *Attorney, Agent, or Firm* — Kaplan Breyer Schwarz & Ottesen, LLP

(57) ABSTRACT

A safety switching device, with which a safety-related device, can be set into a safe state. The safety switching device has a microprocessor or microcontroller, which can set an electric drive to be protected into a safe state both if an emergency circuit breaker, protective door switch, and/or two-hand switch is activated and also if there is faulty operation of the safety-related device or electric drive. For this purpose, the microprocessor is implemented such that it can determine from at least one analog signal to be measured whether a predetermined parameter lies outside a predetermined operating range. In addition, the microprocessor can be a component of a safety device which is constructed for multiple-channel control of a safety-related electric drive. In this way, the safety switching device can respond to several safety functions independent of each other in order to set an electric drive into a safe state.

25 Claims, 13 Drawing Sheets

U.S. PATENT DOCUMENTS

| | | | |
|---|---|---|---|
| 5,650,901 A | 7/1997 | Yamamoto | |
| 6,175,780 B1* | 1/2001 | Engel | 700/293 |
| 6,246,318 B1* | 6/2001 | Veil et al. | 340/458 |
| 6,385,562 B1* | 5/2002 | Roth et al. | 702/188 |
| 6,778,080 B2* | 8/2004 | Veil et al. | 340/506 |
| 6,787,940 B2* | 9/2004 | Pullmann | 307/326 |
| 6,825,579 B2* | 11/2004 | Ehrlich et al. | 307/113 |
| 7,152,188 B1* | 12/2006 | Meyer-Grafe et al. | 714/43 |
| 7,610,119 B2* | 10/2009 | Abe et al. | 701/1 |
| 7,656,629 B2* | 2/2010 | Pullmann et al. | 361/62 |
| 7,948,391 B2* | 5/2011 | Pullmann et al. | 340/679 |
| 2010/0207720 A1* | 8/2010 | Frevert | 340/3.42 |

FOREIGN PATENT DOCUMENTS

| | | |
|---|---|---|
| DE | 1 227 109 B | 10/1966 |
| DE | 1227109 | 10/1966 |
| DE | 1 415 980 A1 | 1/1969 |
| DE | 196 01 540 A1 | 11/1996 |
| DE | 197 07 241 A1 | 9/1998 |
| DE | 100 16 712 A1 | 10/2001 |
| DE | 100 41 633 A1 | 3/2002 |
| DE | 101 27 233 C1 | 11/2002 |
| EP | 0 610 711 A1 | 8/1994 |
| EP | 0 772 216 A1 | 5/1997 |
| EP | 1132744 A2 | 9/2001 |
| EP | 1 363 306 A2 | 11/2003 |
| EP | 1 484 780 A | 12/2004 |
| GB | 489810 A | 8/1938 |
| GB | 2 215 474 A1 | 9/1989 |
| JP | 56-94985 A | 7/1981 |
| JP | H8-315666 | 11/1996 |
| JP | 2004-297997 A | 10/2004 |
| WO | 01/27954 A1 | 4/2001 |

OTHER PUBLICATIONS

International Preliminary Examination Report and Written Opinion, dated Mar. 6, 2008.

Fueyo M. Ramirez, "EP Application 08 01 7535 Search Report", Jul. 29, 2009, Published in: EP.

Fei Han, "CN Application No. 201010610763.X Office Action Sep. 22, 2011", , Publisher: SIPO, Published in: CN.

"Not-Aus-Schltgeraete, Schutztuerwachter" Announcement Piltz NSG-D-1-051-07/00, Jul. 2000, XP000961973.

FEI HANQ, "CN Application No. 201010610763.X Office Action", Jul. 13, 2012, Publisher: SIPO P.R.C, Published in: CN.

* cited by examiner

900

FIG. 2 (PRIOR ART)
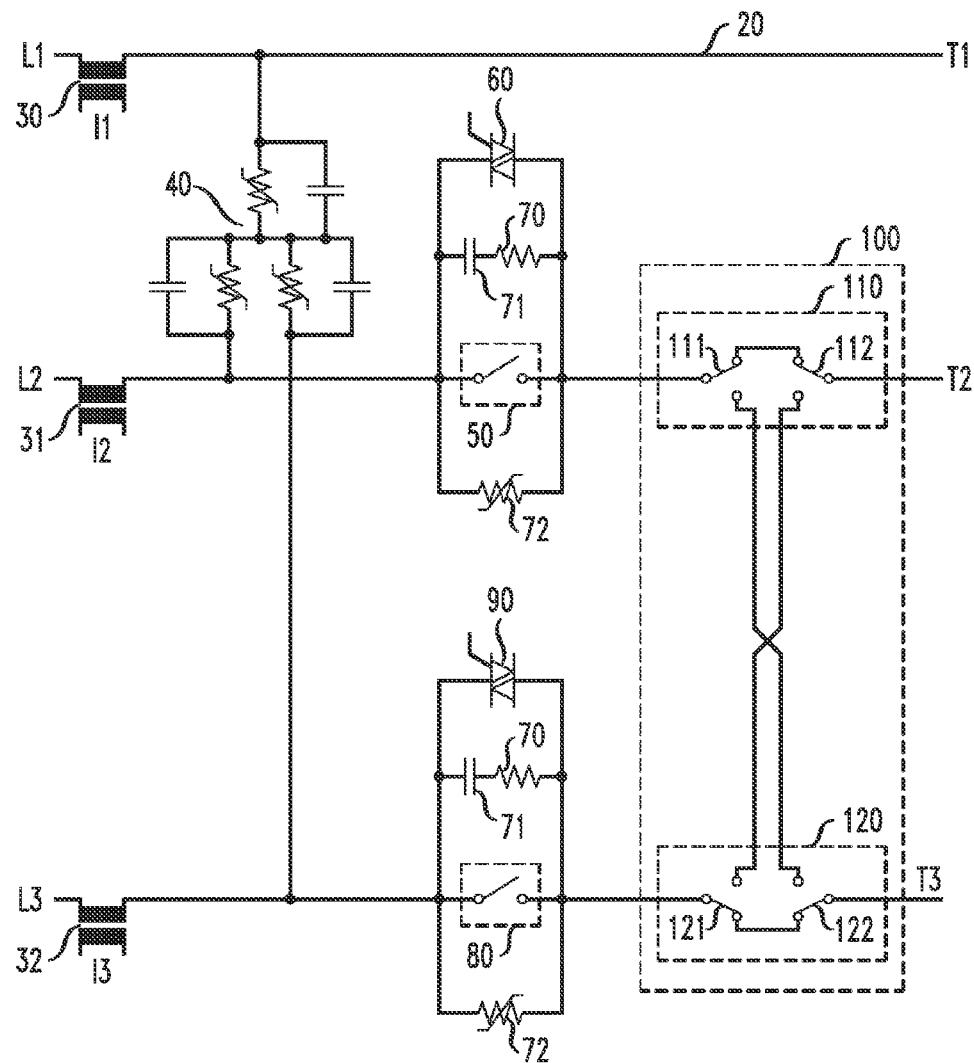
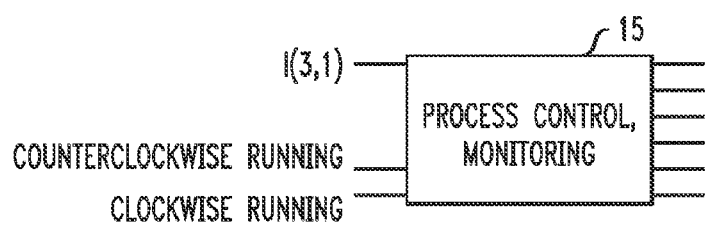

400

500

610

830

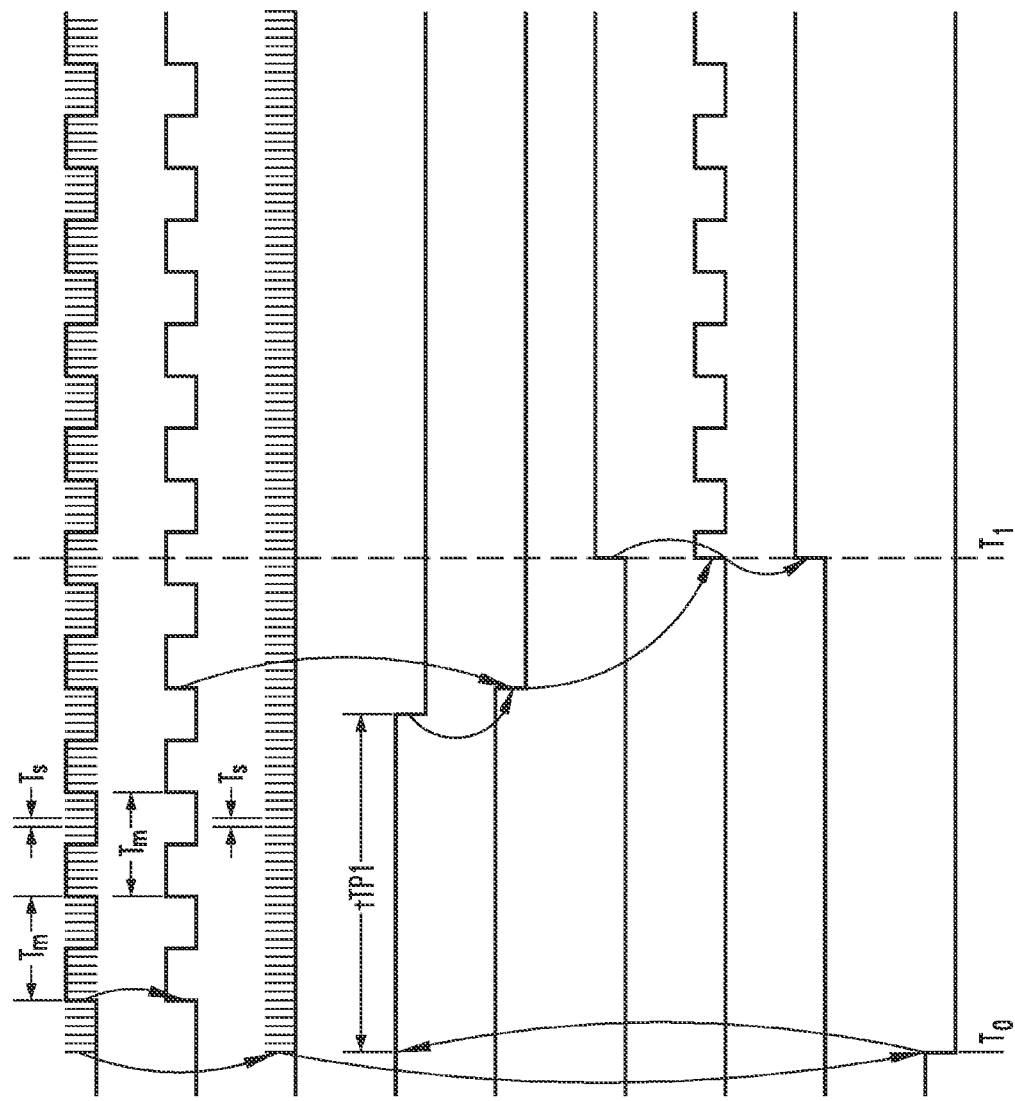

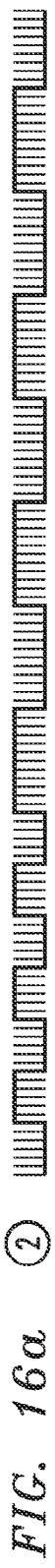
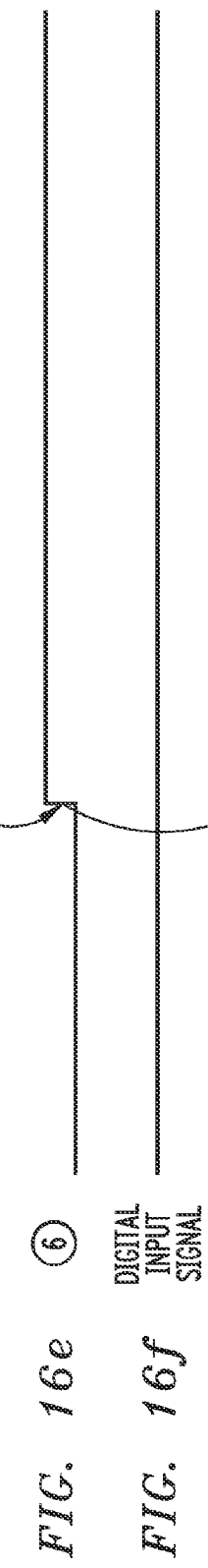
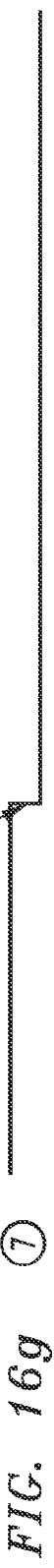
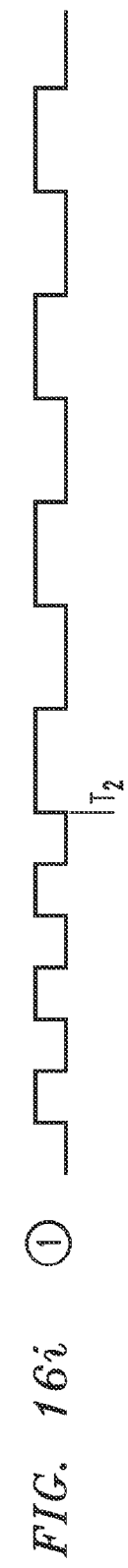
FIG. 16a
FIG. 16b
FIG. 16c
FIG. 16d
FIG. 16e
FIG. 16f
FIG. 16g
FIG. 16h
FIG. 16i

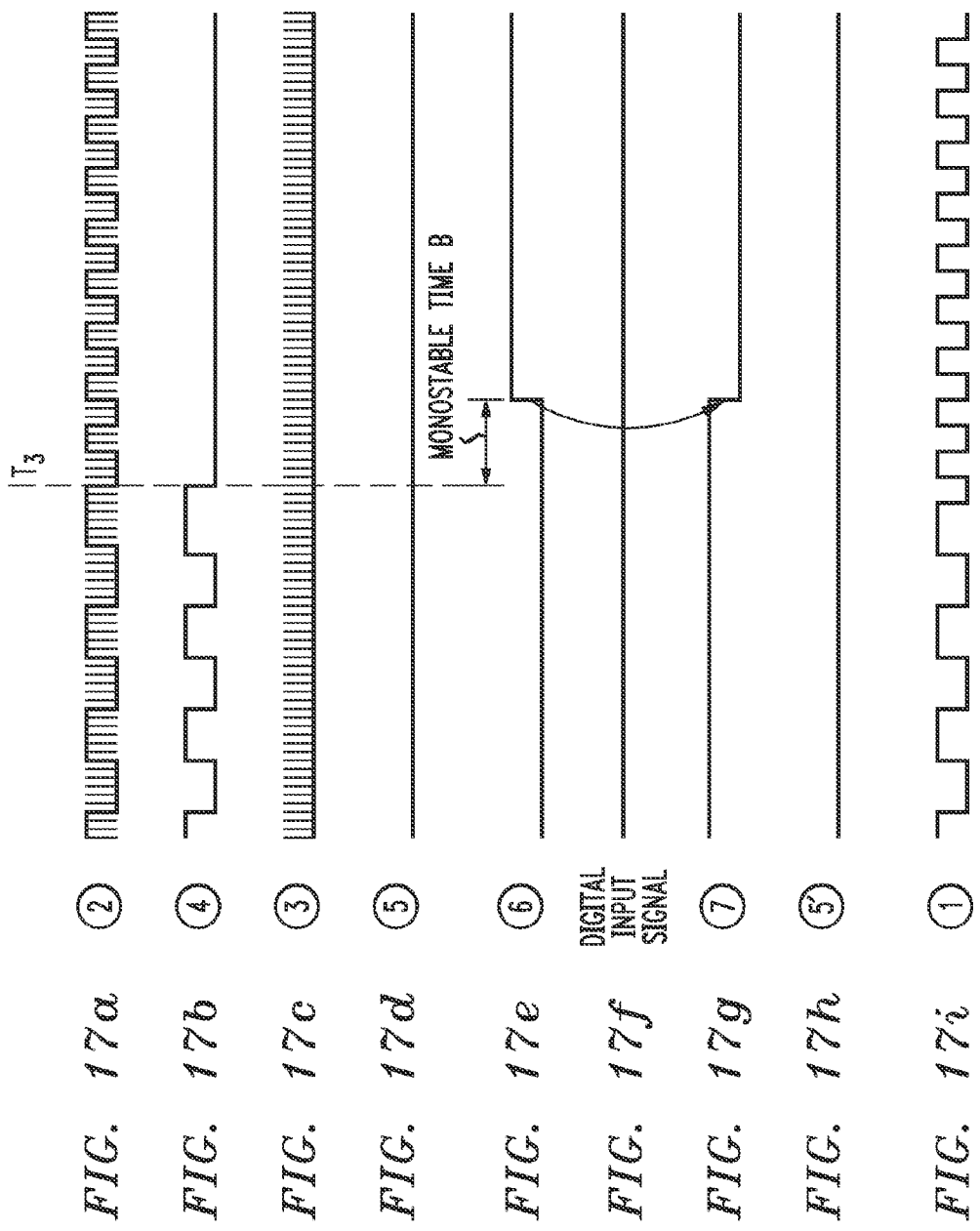

SAFETY SWITCHING DEVICE FOR SETTING A SAFETY-RELATED DEVICE TO A SAFE STATE

FIELD OF THE INVENTION

The invention relates to a safety switching device, with which a safety-related device, preferably an electric drive, can be set to a safe state. Furthermore, the invention relates to a three-phase power amplifier for driving at least one load, a measurement device for measuring a periodic analog signal, whose amplitude can lie outside a preset operating range, and also a safety device for multi-channel control of a safety-related device, which are all together suitable for use in a safety switching device.

BACKGROUND OF THE INVENTION

So that an electrical drive, for example, a three-phase-current motor, can be used in applications or systems as a safety-related component, safety relays, motor protective switches, or motor protective relays and fuses are necessary, which can move the drive into a safe state. Safety relays are used to turn off an electric drive as soon as an emergency shutdown switch, protective door switch, or two-hand switch has been activated. Motor protective switches have the task, for example, if there is a thermal overload, of moving the drive into a safe state with the help of bimetals.

A disadvantage in such safety measures is that the components have large space requirements and considerable wiring complexity. This leads to, among other things, high costs and significant maintenance expense. In addition, the electromagnetic contactors that are used exhibit contact wear. In addition, there is the risk that, in the implementation of a system with safety-related components, the motor protective switches and the safety relays will be connected incorrectly to the safety-related components, or defective components will be used, so that the system, the electric drive, and/or operating personnel can be endangered due to incorrect operation.

SUMMARY OF THE INVENTION

Consequently, the invention is based on the task of creating a compact safety-related device, which avoids the disadvantages named above and also guarantees that a safety-related device, especially an electric drive, can be transitioned into a desired safe state quickly and reliably if an error appears in the application, the system, the safety-related device, and/or the safety switching device itself.

A core concept of the invention is to be seen in designing a safety switching device with an integrated programmable control unit, for example, a microprocessor, a microcontroller, or an FPGA (Field Programmable Gate Array), which can drive, for example, an electric drive to be protected into a safe state both if an emergency shutdown switch, protective door switch, and/or two-hand switch is activated and also for incorrect operation of the safety switching device or the electric drive. Here, the microprocessor is preferably implemented so that it can determine from at least one analog signal to be measured whether a preset parameter, preferably the amplitude of the analog signal, lies outside a preset operating range. In addition, the microprocessor can be a component of a safety device, which is constructed for multi-channel control of a safety-related electric drive. In this way, it is achieved that the safety switching device can respond to two independent safety functions, in order to drive an electric drive into a safe state. In addition, for such a compact safety switching device, the risk of a wiring error is reduced significantly relative to known measures.

Accordingly, a safety switching device for setting at least one safety-related device in a safe state is provided. The safety switching device has a first connection device for connecting the safety switching device to a single-phase or multi-phase power supply device, at least one second connection device for connecting to a safety-related device, a third connection device for connecting at least one safety-related input stage, a single-phase or multi-phase power amplifier connected between the first and second connection devices with at least one drivable switch contact, a measurement device, and a safety device for multi-channel driving of the power amplifier. The safety device has, in turn, the following features: a first control device, which has a programmable control unit and a signal generating device for generating a monitoring signal, a second control device, wherein the input stage is connected to the first device and the second control device and is constructed for modulating an input signal with the monitoring signal coming from the first control device, wherein the first control device and/or the second control device drive the safety-related device into a predetermined safe state if a fault appears as a response to the modulated input signal, wherein the first control device is allocated to the measurement device and is constructed such that it drives the safety-related electrical device into a predetermined safe state via the power amplifier as a response to a measured analog signal if a predetermined parameter of the measured analog signal lies outside a predetermined operating range.

Thanks to this measure, it is possible to move a safety-related device into a predetermined safe state, that is, if a safety-related device, for example, an emergency circuit breaker, is activated, the supply current exceeds a threshold, or a fault occurs in the safety-related device or in the safety switching device.

Preferably, the power amplifier is a three-phase power amplifier, which has a first, second, and third wire that can be connected via the first connection device to a three-phase current power supply device, wherein at least one controllable switch contact is allocated to each wire for opening and closing the appropriate wire, and wherein at least two of the switch contacts are controlled independently of each other. In this case, the measurement device measures, for example, the wire current in two wires and tests whether a predetermined parameter of at least one of the two currents lies outside the predetermined operating range.

The measurement device is in the position to alternatively or additionally measure a wire voltage. From the measured voltages and the associated currents, the measurement device can determine the effective power. In this case, the safety-related switching device can be used not only for protecting people and motors, but also for protecting the system, because the effective power is proportional to the output torque of an electrical drive.

To obtain a compact, easy-to-handle safety-related device, for which the risk of incorrect wiring can be significantly reduced, the first connection device, the one or more second connection devices, the third connection device, the power amplifier, the measurement device, and/or the control devices are arranged on a circuit board.

According to another viewpoint of the invention, a safety device is created for multiple-channel control of a safety-related device, which can be integrated into the safety switching device.

Automation systems usually comprise field-bus systems, to which safety-related and non-safety-related actuators, sensors, as well as higher-level and/or lower-level control and monitoring devices can be connected. An actuator can contain, for example, an electrical drive, for example, a three-phase-current motor. One important requirement on such automation systems is that if a fault occurs, a safety-related component, e.g., an actuator or even the entire automation system, can be moved into a safe state. To allow safe deactivation of the automation system or a defective actuator, it must be guaranteed that a defined input signal, which is to move the automation system into the safe state, is always interpreted correctly.

For systems and devices which belong to a certain safety category, for example, multiple-channel monitoring systems are used that contain subsystems which operate independently of each other and which can each move the system or individual devices into a safe state. The multiple-channel or redundantly constructed monitoring systems are further constructed so that the subsystems can monitor the functionality of each other subsystem. The mutual monitoring is usually performed through a bidirectional exchange of status data. Such known multiple-channel monitoring systems are constructed symmetrically. This means that an input signal, which is delivered by an input stage and which controls the operating state of a system to be monitored, is applied directly to the input of each subsystem of the monitoring system, as shown in FIG. 9.

A core idea of the invention is to be seen in that, in contrast to existing symmetric, multiple-channel monitoring systems, also called safety devices below, in which the input signal prepared by an input stage is applied directly to each subsystem, the input signal is modulated in a predetermined way and then fed to the subsystems, also called control devices below. In particular, for the safety device according to the invention, there is no mutual monitoring of the different control devices. Instead, a microprocessor-controlled control device acts as a master, which monitors the other control device, which is operated as a slave.

Accordingly, a safety device is provided for the multiple-channel control of a safety-related device. At this point, it should be noted that a safety-related device can involve an actuator of an automation system, an executable safety-related application, and/or an automation system itself.

For this purpose, a first, microprocessor-controlled control device is provided, which forms a first so-called control channel. The first microprocessor-controlled control device has a signal-generating device for generating a monitoring signal. A second control channel has a second control device.

The monitoring signal is used primarily for allowing the safety device, especially the second control device, to monitor the proper functioning of the first microprocessor-controlled control device.

An input stage, which is constructed for modulating an input signal with the monitoring signal coming from the first microprocessor-controlled control device, is connected to the first microprocessor-controlled device and to the second control device. The first microprocessor-controlled control device and/or the second control device set the safety-related device for the occurrence of a fault into a predetermined safe state as a response to the modulated input signal.

The first microprocessor-controlled control device preferably executes safety-related programs or program parts, in order to process the modulated input signal, for example, under safety-related viewpoints. Thus, the modulated input signal can be coded, for example, in a defined way.

The signal generating device is constructed such that it generates the monitoring signal as a function of the processing of at least one safety-related program by the first microprocessor-controlled control device. At this point it should be mentioned that the signal generating device is preferably a component of a microprocessor of the first microprocessor-controlled control device.

The first microprocessor-controlled control device and the second control device are connected to an output stage. The control devices each have a device for activating or deactivating the output stage. In particular, the output stage contains at least one switching device, which can be a relay. However, the output stage can also have several switching devices, which allow a gradual or soft deactivation of a safety-related device.

The activation/deactivation device of the first microprocessor-controlled control device has a switch that can be connected to ground, while the second control device has a switch that can be connected to a power supply voltage. Alternatively, the first control device can naturally also have a switch that can be connected to a power supply voltage and the second control device can have a switch that can be connected to ground. In this way, the control devices can regulate the output stage independently of each other, in order to set the safety-related device into the safe state. According to the circuit-related implementation of the output stage, a safety-related device is in the operating state only when the ground path defined by the first control device to the output stage is closed and the power supply voltage is applied to the output stage via the second control device. The safety-related device can then be moved into a safe state by means of the output stage if either the ground path is opened and/or the power supply voltage is separated from the output stage.

Preferably, the first microprocessor-controlled control device is constructed for monitoring the input stage and/or the second control device.

The modulation of the input signal with the monitoring signal of the first microprocessor-controlled control device can be performed by means of a logic operation device, in particular an AND gate. Alternatively, a common switch, also a mechanical switch, can also be used for modulating the monitoring signal when opening and closing the switch.

To prevent incorrect functioning of the first and/or second control device due to incorrect, uncontrolled oscillation of the monitoring signal, the first microprocessor-controlled control device must deliver a suitable signal shape. For this purpose, the first microprocessor-controlled control device has a modulator for modulating the monitoring signal with a signal whose frequency is higher than the frequency of the monitoring signal. The higher-frequency signal can be the clock signal of the microprocessor controlling the first control device. In this case, the input stage is constructed for modulating the modulated monitoring signal and the input signal. In this case, the second control device must be in the position to be able to detect and evaluate the different spectral portions in the modulated input signal. For this purpose, the second control device has a demodulator, which generates a control signal that sets the safety-related device into the predetermined safe state when a fault occurs as a response to the modulated input signal coming from the input stage and to the modulated monitoring signal coming from the first microprocessor-controlled control device.

For this purpose, the demodulator preferably acts as a band-stop filter. In connection with at least one switching device, especially a monostable multivibrator, the demodulator delivers a control signal for setting the safety-related device into the safe state when the frequency of the higher-frequency signal changes by a predetermined quantity.

Preferably, the demodulator has a high-pass filter and a first low-pass filter, each of whose inputs is connected to the output of the first microprocessor-controlled device. A first monostable multivibrator is provided, which has a reset input and a signal input that is connected to the output of the high-pass filter. A second low-pass filter is provided, whose input is connected to the negated output of the first monostable multivibrator. Furthermore, a second monostable multivibrator is provided, whose signal input is connected to the output of the first low-pass filter and whose reset input is connected to the output of the second low-pass filter. Furthermore, a third monostable multivibrator is provided, whose signal input is connected to the output of the input stage and whose reset input is connected to the negated output of the second monostable multivibrator.

Preferably, the first microprocessor-controlled control device is software-based and the second control device is hardware-based, i.e., realized according to circuitry. Furthermore, the second control device can also be controlled by a microprocessor.

The input signal can involve a binary process signal, which is used for the start-up and the safe deactivation of a safety-related device.

According to another viewpoint of the invention, a three-phase power amplifier is provided, which can also be integrated into the safety switching device.

Three-phase power amplifiers have been known for a long time and are used for making three-phase current generated by a three-phase-current generator available to loads in a controlled way. The loads can be connected to one phase or to all three phases of the power amplifier and in this way are supplied with alternating or three-phase current.

A known three-phase power amplifier is shown as an example in FIG. 2. The power amplifier designated in general with 10 has three wires 20, 21, and 22, also called phases. Conventionally, the wire ends leading to a not-shown three-phase-current power supply device are designated with L1, L2, and L3. Feeding of an alternating current into the wires 30, 31, and 32 is shown symbolically by transformers 30, 31, and 32, respectively. To protect the electronic components of the power amplifier 10 and/or the loads connected thereto from overvoltages, there is an overvoltage protection circuit, designated overall with 40, between the wires 20, 21, and 22. The overvoltage protection circuit 40 can have several series and/or parallel circuits made from capacitors, resistors, and/or varistors. Such overvoltage protection circuits are known and thus do not need a more detailed explanation.

The output-side wire ends are designated conventionally with T1, T2, and T3. As FIG. 2 shows, a switch contact 50, which is part of a relay, is connected in the wire 21. A semiconductor component 60, which acts as an alternating-current switch and which can be implemented by a triac or by a corresponding thyristor circuit, is connected parallel to the switch contact 50. A protection circuit, which can comprise a series circuit made from a resistor 70 and a capacitor 71 and a varistor connected parallel to these components, is provided parallel to the triac 60. The protection circuit is used for protecting the triac 60 and/or optical triacs, which deliver the trigger voltage for the triacs, from voltage spikes. It should be noted that such protection circuits for semiconductor switches, for example, the triac 60, are known and thus do not have to be explained further.

A switch contact 80, which belongs to a separate relay, is likewise connected in the wire 22. A semiconductor switch 90 in the form of a triac and also a protection circuit in the form of a series circuit made from a resistor 70 and a capacitor 71, as well as a varistor 72 connected parallel to these components, are provided, in turn, parallel to the switch contact. Furthermore, a reversing switch device 100, which has a relay 110 allocated to the wire 21 and a relay 120 allocated to the wire 22, is provided between the second and third lines 21 and 22. The relay 110 allocated to the wire 21 has two switch contacts 111 and 112, while the relay 120 allocated to the wire 22 has switch contacts 121 and 122. The reversing circuit 100 is used for changing the running direction of a connected three-phase-current motor. In the switch state shown, the switch contacts 111 and 112 of the relay 110 connect the input L2 to the output T2 of the wire 21, while the switch contacts 121 and 122 of the relay 120 connect the input L3 to the output T3 of the wire 22. In the connected state, a connected three-phase-current motor rotates clockwise, for example, in this switch contact position. If the relays 110 and 120 are triggered, then the corresponding switch contacts 111 and 112 and 121 and 122, respectively, ensure that an alternating current is led via the wire 22 to the output of the wire 21 and an alternating current is led from the wire 21 to the output of the wire 22. In this way, the running direction of a connected three-phase-current motor is changed.

The relays 110 and 120 of the reversing circuit 100 used in the known power amplifier ensure that the wires 21 and 22 are conductive continuously. Deactivating the known power amplifier 10 is only possible with respect to the wires 21 and 22, in that the switch contacts 50 and 80 are opened, so that the triacs 60 and 90 allocated to the two wires respectively, are operated in a blocked mode. Because the triacs alone must block a current flow through the wires 21 and 22, special semiconductor components are used, which can withstand an off-state voltage of approximately 1200 V.

The known power amplifier shown in FIG. 2 is not suitable for fulfilling the requirements of safety category 3, because three-phased deactivation of the power amplifier is not possible. This is because there is no switch in the wire 20 that could open the wire.

Another aspect of the invention is to be seen in that the three-phase power amplifier named above is further developed such that this fulfills the requirements of the safety category 3 and also the stop categories 0 and 1.

Another aspect of the invention is to be seen in that a novel reversing switch device is specified, which allows the use of more economical semiconductor components for the semiconductor switches used for the power amplifier. Thanks to the novel reversing switch device, the semiconductor switches are exposed to lower off-state voltages, i.e., approximately 800 V, namely in the blocked state, than in the power amplifier shown in FIG. 2, in which the off-state voltages lie at approximately 1200 V. Furthermore, the protection circuits provided in the known three-phase power amplifier according to FIG. 2 for the semiconductor switches can be eliminated in the novel power amplifier.

A core idea of the invention is to be seen in that a three-phase power amplifier is created which can be completely deactivated and which thus satisfies the requirements of safety category 3. For this purpose, it is necessary that each wire of the three-phase power amplifier can be deactivated.

Another core idea of the invention is to be seen in that the electrical loading of the semiconductor switches that are used is reduced in the deactivated operation of the power amplifier. For this purpose, a special reversing switch device is used, in which, for example, two relays each having two switch contacts are connected in parallel between two wires, such that the two wires are separated for a predetermined switch contact position. Consequently, a current flow through these two wires is not just blocked, like in the state of the art, by the semiconductor switches that are used, but instead mainly by the electromechanical switch contacts of the reversing switch device.

Accordingly, a three-phase power amplifier is provided for driving at least one load, especially a three-phase-current motor, which has a first, second, and third wire. On the input side, the three-phase power amplifier can be connected to a three-phase current power supply device. So that the three-phase power amplifier can satisfy the requirements of safety category 3 as well as category 0-stop or 1-stop, at least one switch contact is allocated to each wire at the opening and closing end of each wire. To more safely guarantee the three-phase deactivation of the power amplifier, at least two of the switch contacts, which are allocated to different wires, are driven independently of each other.

At least one switch contact in each wire is allocated to an electromagnetic switch element. In this way it is guaranteed that the wires can be mechanically disconnected even with the use of semiconductor switches, for example, in the second and third wires. Because the drive in the deactivated state is not powered, there are no voltages dangerous to touch relative to the power amplifier shown in FIG. 1.

Preferably, a first switch element with first and second switch contacts is connected between the second and third wires, wherein the first switch contact is connected parallel to one of the semiconductor switches and the second switch contact is connected parallel to the other semiconductor switch. The first and second switch contacts can each involve the mentioned controllable switch contact.

The semiconductor switches can involve triacs, which are alternating-current switches, whose trigger power is provided by a device connected to a power supply voltage. The device for providing the trigger energy is constructed so that it holds the semiconductor switches in the triggered state for a predetermined time, even if in the meantime the first and second switch contacts of the first switch element are driven. This guarantees that the first switch element arranged between the second and third wires is connected with almost no wear.

To be able to reduce the off-state voltage applied to the semiconductor switch in the deactivated state of the three-phase power amplifier—typically 1000 V off-state voltages are applied to semiconductor switches—between two wires, there is a reversing switch device containing two second switch elements, which can be driven independently of each other and which each have first and second switch contacts, wherein the first switch contacts of the switch elements are connected to one wire and the second switch contacts of the switch elements are connected to the other wire. In a predetermined position of the first and second switch contacts, the current flow through the two wires is blocked. Consequently, the blocking function is no longer burdened exclusively on the semiconductor switches, but instead is supported by mechanical switches. Consequently, the power amplifier can be deactivated current-free relative to the known power amplifier according to FIG. 1.

According to a first alternative, the first switch contacts of the second switch elements of the reversing switch device are connected to the second wire and the second switch contacts of the second switch elements are connected to the third wire.

Preferably, in the first alternative, a third switch element is connected to the first wire with at least two switch contacts. In this way, it is guaranteed that at least two switch contacts are provided in each wire of the three-phase power amplifier. This guarantees that the three-phase power amplifier fulfills stop category 0 and stop category 1 provisions. Then, even if a switch contact fails, a safe three-phase deactivation of the power amplifier is still always possible.

An alternative wiring of the reversing circuit device provides that the first switch contacts of the two second switch elements are connected to the first wire and the second switch contacts of the two second switch elements are connected to the third wire.

The degree of safety can be increased by deactivating the power amplifier according to the second alternative relative to the first alternative, such that a third switch element is provided with first and second switch contacts, wherein the first switch contact is connected to the first wire and the second switch contact is connected to the second wire. This guarantees that two switch contacts and semiconductor switches that can be controlled independently of each other are provided in each wire.

Therefore, because preferably only relays each with two switch contacts are used in the power amplifier, the number of relays used remains the same for significantly improved safety relative to the power amplifier shown in FIG. 1.

Conventionally, the semiconductor switches are each protected from overvoltages and other electrical interference by a protection device. At this point it should be noted that the special wiring of the reversing switch device and the use of an electromechanical switch element, whose two switch contacts are connected either in the wire 1 or in the first and second wires, allow the use of semiconductor switches also without protection circuits.

In a known way, a protection circuit against overvoltages can be connected between the three wires.

For proper activation and deactivation of the three-phase power amplifier, a control device, if necessary also a programmable control device, is provided for driving the switch elements and semiconductor switches.

To be able to deactivate the three-phase power amplifier quickly and reliably when a fault occurs, a monitoring device is provided which can monitor the current flowing in the wires, the output voltages present between the wires, and/or the running direction of at least one connected three-phase-current motor, wherein the control device drives the corresponding switch elements and semiconductor switches as a response to the monitoring device.

The technical problem named above is similarly solved by a reversing switch arrangement, which is provided especially for a three-phase power amplifier. The reversing switch arrangement has two switch elements, which can be controlled independently of each other and which each have a first and second switch contact. The first switch contacts of the switch elements are connected to a first wire and the second switch contacts are connected to a second wire. The wiring and arrangement of the switch contacts are selected such that the current flow through the connected wire is blocked in a predetermined position of the first and second switch contacts.

According to another aspect of the invention, a device for measuring a periodic analog signal is provided, which likewise can be integrated in the safety switching device.

The protection of electrical drives, for example, motors, against overcurrents or overvoltages is realized today primarily through mechanical monitoring elements based on bimetals. The trigger characteristics of mechanical bimetals are determined here by the metals that are used and also the heat transfer of the glow plug carrying the motor current. Although temperature-dependent compensation circuits are used, the trigger behavior of mechanical bimetals can be altered by fluctuations in the ambient temperature. In addition, such mechanical monitoring elements are extremely susceptible to contamination and wear of their components, so that monitoring elements must be frequently checked and maintained.

Consequently, in recent years, electronic bimetal switches have been used as monitoring elements with increasing frequency. These operate with significantly more precision and do not have significant wear relative to mechanical monitoring elements and are less sensitive relative to external influences.

However, measurement devices, which are necessary for triggering the electronic bimetal switches, are used for electronic bimetal switches. The measurement devices that are used must be able to detect, among other things, the so-called "inrush," which can equal seven times the nominal motor current, and also must have adequate resolution and accuracy in the nominal current range of a motor. Consequently, an expensive and complex dimensioning of the measurement devices is necessary, so that currents within the largest possible current range, i.e., nominal currents and overcurrents, can be detected. This leads to very large and expensive measurement devices, because the current transformer, in particular, must be overdimensioned accordingly.

A core idea of the invention is to be seen in that a measurement device and a measurement method are provided, with which the peak amplitude of an overcurrent can be estimated under consideration of a known curve shape when there is, in particular, an overcurrent. In this way, it is possible to operate measurement devices also outside the given measurement or operating range, even if the measurement device is dimensioned only for nominal currents lying within the given measurement range.

Thus, the invention is further based on the task of providing a measurement method and a measurement device which are designed for the nominal current range of an electrical device and consequently can be constructed with economical electrical and electromagnetic components and nevertheless overcurrents can be detected.

Accordingly, a measurement device for measuring a periodic analog signal is provided, whose amplitude can lie outside a predetermined operating range. The measurement device has a device for determining the time period during which the amplitude of the analog signal to be measured is greater than or equal to a predetermined threshold in terms of magnitude, as well as an evaluation device which calculates the maximum amplitude of the analog signal to be measured from the determined time period and the signal form, especially the signal frequency of this analog signal.

At this point it should be mentioned that the "predetermined operating range" is understood to be the range within which measurement signals do not drive the measurement device, i.e., one or more electrical components from which the measurement device is constructed, into overflow and thus can be measured in a conventional way. The phrase "greater than in terms of magnitude" takes into account the circumstance that a periodic analog signal can fall outside the range of its maximum and minimum peak values.

Preferably, the determination device of the measurement device has a sampling device for sampling the analog signal to be measured at a sampling rate, as well as a device for detecting and counting successive sampled values which are greater than or equal to the predetermined threshold in terms of magnitude. In this case, the evaluation device is constructed for calculating the maximum amplitude of the analog signal as a function of the number of counted sampled values, the sampling rate, and the signal frequency.

At this point it should be mentioned that the threshold can be, for example, the upper and/or lower limiting value of the predetermined operating range of the measurement device, within which a conventional measurement of the analog signal is possible. However, the threshold can also be less than the upper and/or lower limiting value by a predetermined quantity in terms of magnitude.

If the analog signal involves a sinusoidal signal with a predetermined signal frequency, then the evaluation device can calculate the maximum amplitude value using the equation:

$$I = \frac{1}{\sin\left(\pi\left(\frac{1}{2} - \frac{T_{AS} * N}{T}\right)\right)}$$

In the equation, $T_{AB}$ is the reciprocal of the sampling rate, N is the number of counted sampled values that are greater than or equal to the predetermined threshold in terms of magnitude, and T is the period of the analog signal to be measured.

To be able to reduce the computational power of the evaluation device, an alternative measurement device is provided.

Accordingly, the measurement device has a device for sampling the analog signal at a sampling rate. Furthermore, a device is provided for detecting and counting successive sampled values which are equal to or greater than a predetermined threshold in terms of magnitude. The maximum amplitude value of several reference signals lying outside the predetermined operating range and the associated number of counted sampled values which are greater than or equal to a predetermined threshold in terms of magnitude are stored in a memory device. Furthermore, the measurement device has an evaluation device which reads the associated maximum amplitude value from the memory device as a response to the number of sampled values determined by the detection and counting device. Here, the determined number can be used as a memory address. At this point it should be stressed that the maximum amplitude value involves a calculated amplitude value, which is to be viewed as an estimated value for the actual maximum amplitude value of a signal to be measured lying outside the predetermined operating range.

To be able to evaluate the sampled values digitally, an AD converter is provided for converting the sampled values to corresponding digital values.

The maximum amplitude value can be calculated with more precision the higher the sampling rate of the sampling device. Simultaneously, however, the computational expense increases. Consequently, it is useful if the sampling rate is adjustable.

The measurement device can be used in a device protected against overcurrents, especially in electrical drives, wherein the device protected against overcurrents has a triggering device that can deactivate the device as a response to the calculated maximum amplitude value.

The technical problem named above is similarly solved by a method for measuring a periodic analog signal, whose amplitude can lie outside a predetermined operating range. Initially, the time period during which the amplitude of the analog signal to be measured is greater than or equal to a predetermined threshold in terms of magnitude is determined. As a function of the determined time period and the signal shape, especially the signal frequency of the measurement signal to be measured, the maximum amplitude of the analog signal to be measured, which lies outside the predetermined operating range, is then calculated.

The time period can be determined in that the analog signal to be measured is sampled at a sampling rate. Successive sampled values that are greater than or equal to a predetermined threshold in terms of magnitude are then counted. The maximum amplitude of the analog signal is calculated as a function of the number of counted sampled values, the sampling rate, and the signal frequency.

To reduce the circuitry-related expense and the time expense in calculating the maximum amplitude value, the maximum amplitude lying outside the predetermined operating range and the associated number of sampled values which are greater than or equal to a threshold are determined and stored in advance. Now an analog signal to be measured is sampled at a sampling rate. The successive sampled values which are greater than or equal to the predetermined threshold in terms of magnitude are counted and the maximum amplitude value belonging to the number of counted sampled values is read out.

BRIEF DESCRIPTION OF THE DRAWINGS

The invention is described in more detail below with reference to embodiments in connection with the enclosed drawings. In the drawings, the same reference symbols are used for identical parts or components. Shown are:

FIG. 2, a three-phase power amplifier according to the state of the art,

DETAILED DESCRIPTION

Figure 1:
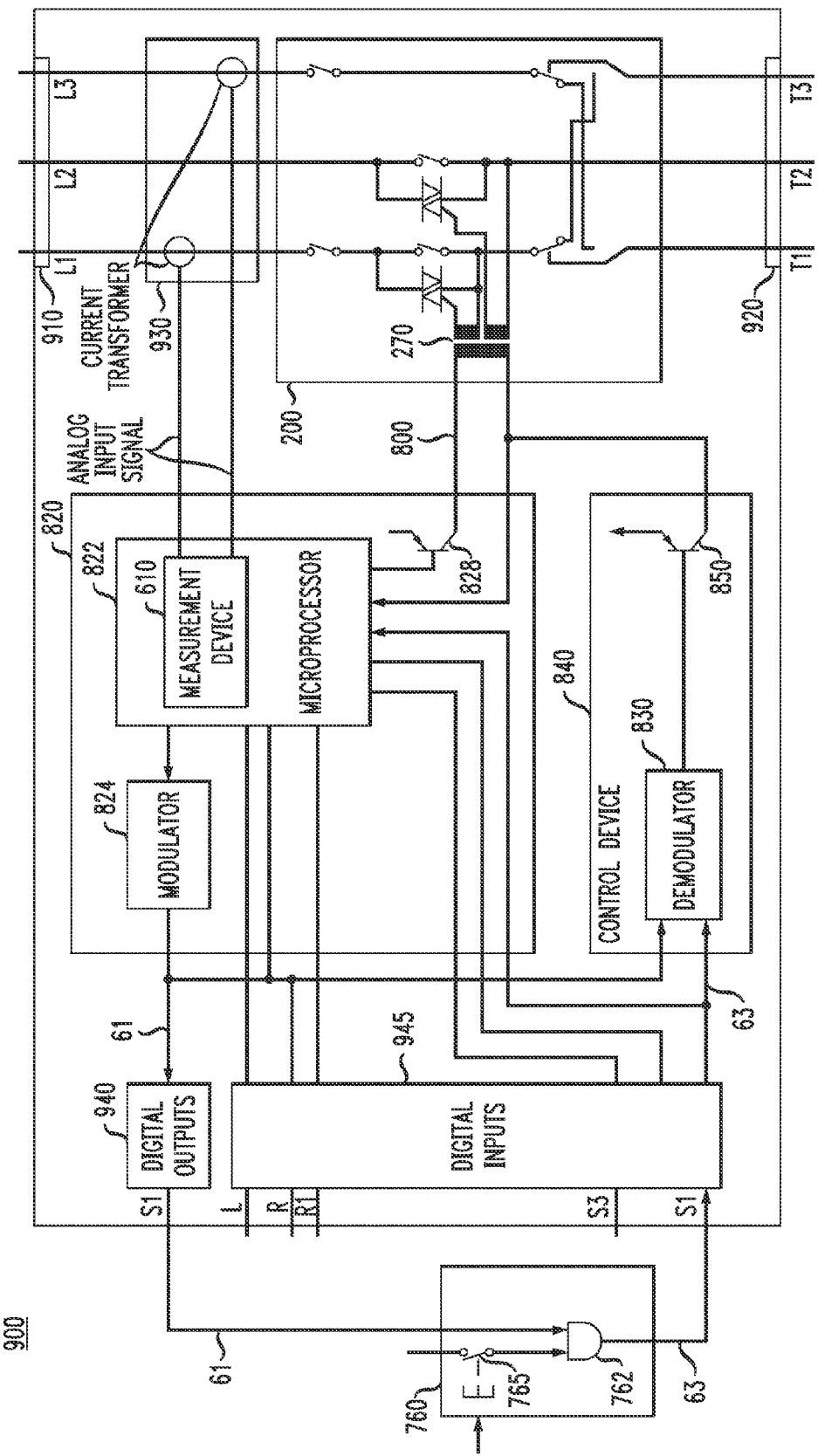
FIG. 1, a safety switching device according to the invention.

In FIG. 1, the block circuit diagram of an example safety switching device 900 is shown, whose components can be accommodated in a housing. The safety switching device 900 has a first connection device 910, by means of which the safety switching device 900 can be connected, for example, to a three-phase power supply network (not shown). The three input wires connected to the power supply network are designated in FIG. 1 with L1, L2, and L3. The three wires L1, L2, and L3 are connected to a power amplifier 200, whose three output-side wires are designated T1, T2, and T3. The three output-side wires are connected to a second connection device 920, to which a safety-related device, for example, a three-phase-current motor, can be connected. It is conceivable that several safety-related devices, e.g., single-phase or multiple-phase drives can also be connected to the safety switching device 900. Accordingly, the power amplifier that is used can have a single-phase or multiple-phase construction. The power amplifier 200 is shown only schematically for the sake of simple representation. The power amplifier 200 is described in more detail below in connection with FIG. 3. At this point it should be noted that instead of the power amplifier shown in FIG. 3, the power amplifier 400 shown in FIG. 4 could also be used.

A device 930 with current transformers in the wires L1 and L3, which feed the analog current into the wires L1 and L3 of a measurement device 610, is connected in the input wires L1, L2, and L3. The measurement device 610 can be a component of a programmable control unit, for example, a microcontroller or microprocessor 822 of a control device 820. It can also be constructed, however, as a separate functional module. The measurement device 610 preferably involves the measurement device 610 described in connection with FIGS. 6 to 8. The main task of the measurement device is to be seen in determining whether the amplitude of the currents in the wires L1 and L3 lie outside a predetermined operating range. If this is the case, the microprocessor 822 controls the power amplifier 200 via a switching transistor 828, in order to separate the connected three-phase-current motor from the not-shown power supply network. As shown schematically in FIG. 1, the switching transistor 828 is connected to a transformer 270 of the power amplifier 200. The microprocessor-controlled control device 820 is described in more detail below with reference to FIGS. 13 and 14. Alternatively or additionally, it is possible to loop voltage transformers, which feed wire voltages to the measurement device 610, into the wires L1 and L3. The measurement device 610 can be constructed such that it determines the effective power from the received voltage signals through multiplication by the associated current signals and tests whether the effective powers lie within or outside a predetermined operating range. The actual values of the operating range and the time periods for how long the current amplitudes are allowed to lie outside the predetermined operating range without deactivating the three-phase-current motor can be adjusted by an operator.

Furthermore, the safety switching device 900 comprises another control device 840, which has a demodulator 830 and a switching transistor 850, which is connected to a different end of the transformer 270 of the power amplifier 200. Both the microprocessor-controlled control device 820 and the control device 840 are components of a multiple-channel safety device 810, which is described in more detail below with reference to FIGS. 13 and 14. It should be noted at this point that instead of the control devices 820 and 840, the control devices 770 and 780 of the safety device 750 shown in FIG. 10 can be used. In this connection, it should also be noted that the output stage 790 shown in FIGS. 10 and 13 corresponds, for example, to the power amplifier 200 used in the safety switching device.

A modulator 824, whose output signal is fed via a digital output of an interface 940 of an input stage 760 connected externally to the safety switching device 900, is allocated to the microprocessor 822 of the first microprocessor-controlled control device 820. One notices that this input stage can involve the input stage 760 of the safety device 750 or 810 shown in FIGS. 10 and 13. The output signal of the second control device 840 is similarly fed to the microprocessor 822, which can test the proper functioning of the second control device 840 as a response to the received output signal. The microprocessor 822 generates, in connection with the modulator 824, a monitoring signal, which signals whether the two control devices 820 and 840 are operating properly. To be able to guarantee that the three-phase-current motor connected to the safety switching device 900 can be moved into a safe state, if either circuit component of the safety switching device 900, especially the control devices 820 and 840, is defective or, for example, an emergency circuit breaker 765 implemented in the input stage 760 is actuated from the outside, both the input signal of the emergency circuit breaker 765 and the output signal of the modulator 824 are fed to a logic operation device 762, which can be, for example, an AND gate. The output signal of the logic operation device 762 of the input stage 760 is fed to a digital input of an interface 945 of the safety switching device 900 via a connection 63. Via the interface 945, the input signal reaches the demodulator 830 of the second control device 840 and the microprocessor 822 via a connection 63'. If the demodulator 830 of the control device 840 or the microprocessor 822 of the control device 820 recognizes that the monitoring signal generated by the modulator 824 signals a system error and/or that the emergency circuit breaker 762 has been activated, then the corresponding switching transistors 828 and 850 are triggered in order to separate the power amplifier 200, so that the power supply via the wires L1, L2, and L3 to the output wires T1, T2, and T3 and thus to the connected three-phase-current motor is disconnected.

At this point it should be indicated that the input stage 760 shown in FIG. 1 contains only one switch 765, which symbolizes an emergency circuit breaker, for the sake of a simple representation. It is also conceivable to use an emergency circuit breaker with several switches, wherein the switches in this case can each be connected to a separate output of the interface 940 and to a separate input of the interface 945. It is further conceivable that the input stage 760 can have a protective door, and/or a two-hand switch as an alternative or addition to an emergency circuit breaker. According to the embodiment, the appropriate output signals are linked into the logic operation device 762 with the monitoring signal of the modulator 824 of the microprocessor-controlled control device 828, as described in more detail below.

Thanks to these special measures, the safety switching device 900 is in the position of taking over a complex and multi-purpose safety-related monitoring function of a safety-related device, for example, a three-phase-current motor, connected to the safety switching device 900. In an especially useful embodiment, the connection devices 910 and 920, the power amplifier 200, the components of the control device 820 and 850, and also the interfaces 940 and 945 are arranged on a circuit board (not shown). Consequently, for the implementation of a system with safety-related devices, all that must be ensured is that the safety-related device is connected to the safety switching device 900. The operator must pay attention to how the safety-related device has to be connected to the appropriate motor protection switches and protection relays and, if necessary, to an emergency circuit breaker. The risk of incorrect wiring is thus significantly reduced relative to known measures.

Furthermore, the interface 945 can have two digital inputs, to which two lines R and L are connected, by means of which the control signals for clockwise and counterclockwise running of a three-phase-current motor can be applied. The control signals are likewise fed to the microprocessor 822, which controls the power amplifier accordingly. The individual connection lines are not shown in FIG. 1 for the sake of better clarity. Furthermore, the interface 945 has another input R1 to which a not-shown reset key can be connected. For example, the flank of an applied reset signal can be detected by the microprocessor 822, which then controls the power amplifier 200, in order to set the three-phase-current motor back in operation after deactivating the three-phase-current motor due to an error.

Three-Phase Power Amplifier

Figure 3:
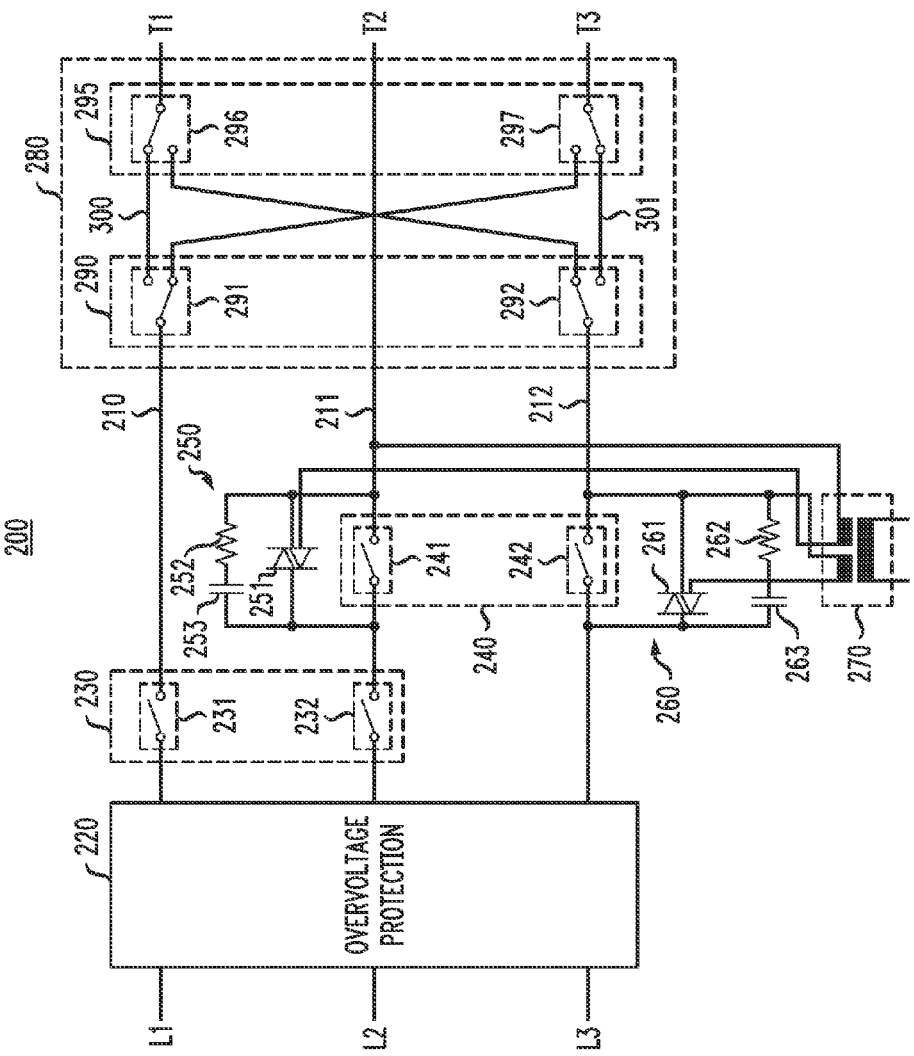
FIG. 3, a shown three-phase power amplifier according to the invention.

FIG. 3 shows the three-phase power amplifier with three wires 210, 211, and 212, which can be used in the safety switching device 900. The wire ends pointing toward a not-shown three-phase-current power supply device conventionally carry the designations L1, L2, and L3, while the remote wire ends carry the typical designations T1, T2, and T3. In the vicinity of the wire ends L1, L2, and L3, there is a known overvoltage protection circuit 220, which can be constructed similar to the protection circuit 40 shown in FIG. 2, between the three wires 210, 211, and 212. An electromechanical switch element 230, which in the present example is a relay with two switch contacts 231 and 232, is connected between the wires 210 and 211. The switch contact 231 is connected in the wire 210, while the switch contact 232 is connected in the wire 211. A second electromechanical switch element 240, which in the present example is, in turn, a relay, is connected between the wire 211 and the wire 212. The relay 240 has, in turn, two switch contacts 241 and 242. The switch contact 241 is connected in the wire 211, while the switch contact 242 is connected in the wire 212. A switch device, which is designated in general with 250 and which has, as a semiconductor element, a triac, that is, an alternating-current switch, and a series circuit made from a resistor 252 and a capacitor 253 connected parallel to this triac, with this series circuit acting as a protective circuit for the triac 251, is connected parallel to the switch contact 241. At this point it should be mentioned that the special circuit arrangement of the three-phase power amplifier 200 has the result that the protective circuit is not necessary. The reason for this is discussed in more detail below.

In a similar way, a switch device 260, which likewise has a semiconductor switch 261 constructed as a triac, is connected parallel to the switch contact 242. Furthermore, an optional protection circuit is connected parallel to the semiconductor switch 261. The protective switch contains, in turn, for example, a capacitor 263 and a resistor 262. The triggering energy for the triacs 251 and 261 is delivered, for example, by a transformer 270, which can be connected to an alternating voltage. The triggering energy for the triacs 251 and 261 can also be provided in a known way by an optical triac. Instead of triacs, anti-parallel thyristors can also be used as the semiconductor switches 251 and 261.

At this point it should be mentioned that an advantage of the three-phase power amplifier shown in FIG. 3 relative to the known power amplifier shown in FIG. 2 is to be seen in that more cost-effective components can be used as semiconductor components for the semiconductor switches 251 and 261 because the semiconductor switches 261 and 251 are exposed to an off-state voltage of merely approximately 800 V, while the semiconductor switches 60 and 90 must withstand off-state voltages of approximately 1200 V. One reason for this is to be seen in that the reversing protection circuit 100 according to the power amplifier shown in FIG. 2 controls merely the running direction of a connected, not-shown three phase-current motor. In contrast, in the power amplifier 200 according to FIG. 3, a reversing switch device 280 is used, which can change not only the running direction of a connected three-phase-current motor, but which is also used for deactivating the power amplifier. For this purpose, the reversing switch device 280 has two electromechanical switch elements 290 and 295, which are connected in parallel between the wires 210 and 212. Both switch elements are constructed, for example, as relays. The relay 290 has two switch contacts 291 and 292, wherein the switch contact 291 is connected to the wire 210 and the switch contact 292 is connected to the wire 212. The relay 295 likewise has two switch contacts 296 and 297. The switch contact 296 is connected to the connection T1 of the wire 210, while the switch contact 297 is connected to the connection T3 of the conductor 212. Therefore, because the switch elements 290 and 295 are arranged between the wires 210 and 212, their switch contacts can be driven in opposite senses, such that the reversing circuit 280 separates the wires 210 and 212 in the shown position of the switch contacts 291, 292, 296, and 297. A current flow through the wires 210 and 212 is thus mechanically interrupted. A current flow from the wire beginning L1 to the wire output T3 or from the wire beginning L3 to the wire output T1 is achieved, in that the switch contacts 296 and 297 of the relay 295 are connected toward the inside and are therefore connected to crossed wire sections 302 and 303, respectively.

In contrast, if the switch contacts 291 and 292 of relay 290 are connected toward the outside, then they contact the wire sections 300 and 301, respectively, with the switch contacts 296 and 297 of the relay 295. This position of the switch contacts allows for a current flow through the wires 210 and 212, if the switch contact 231 and the switch contact 242 are closed and/or the triac 261 is triggered.

Thanks to the relay 230, the special wiring of the reversing switch device 280 between the wires 210 and 212, the relay 240, which is connected in the wires 211 and 212, and also the semiconductor switches 251 and 261, the requirements of safety category 3 for three-phase power amplifiers are guaranteed because a three-phase deactivation of the power amplifier 200 is possible. Furthermore, in the present embodiment, in each wire there are at least two mechanical switch contacts, which then also achieve safe deactivation of the power amplifier if a switch contact or a semiconductor switch element is defective. Because, as already mentioned, the reversing switch device 280 has a deactivation function for the wires 210 and 212 in contrast to the reversing switch device 100 shown in FIG. 2, and furthermore because a separate switch contact 232 is arranged in the wire 211, in the deactivated state, lower off-state voltages are applied to the semiconductor elements 251 and 261 than to the semiconductor switch elements 60 and 90 of the power amplifier shown in FIG. 2. Thus, more economical components can be used for realizing the semiconductor switch elements, and protective circuitry can be eliminated.

Figure 4:
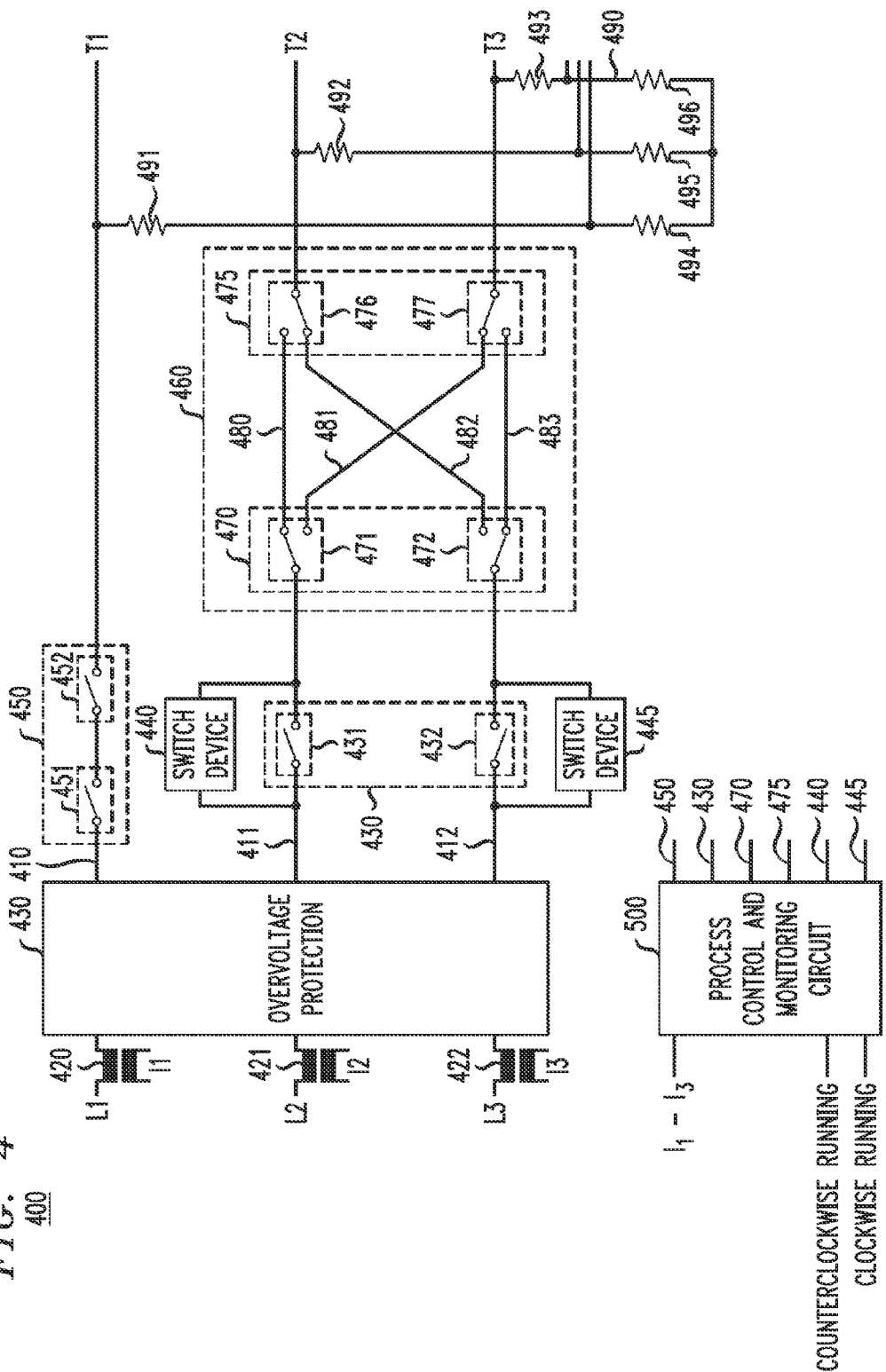
FIG. 4, an alternative three-phase power amplifier according to the invention.

In FIG. 4, an alternative embodiment of a three-phase power amplifier is shown, which is designated in general with 400. Similar to the power amplifier 200 shown in FIG. 3, the power amplifier shown in FIG. 4 has, in turn, at least two mechanical switch contacts in each wire. The power amplifier 400 also has three wires, which are designated in FIG. 4 with 410, 411, and 412. Alternating currents are fed into the wires 410, 411, and 412, for example, via transformers 420, 421, and 422. On the input side, an overvoltage protection circuit 430 is connected between the wires 410, 411, and 412, similar to the power amplifier 200 shown in FIG. 3. Similar to the power amplifier 200 shown in FIG. 3, between the wires 411 and 412 there is an electromechanical switch element in the form of a relay 430, which has two switch contacts 431 and 432. The switch contact 431 is located in the wire 411, while the second switch contact 432 is located in the wire 412. A switch device 440, which, similar to the switch device 250 shown in FIG. 3, can have a semiconductor switch element, which can be a triac, and optionally a protection circuit, is connected parallel to the switch contact 431. In a similar way, a switch device 445, which, in turn, can have a semiconductor switch constructed as a triac and optionally a protection circuit, is connected parallel to the switch contact 432. In contrast to the power amplifier 200 shown in FIG. 3, a relay 450 with, for example, two switch contacts 451 and 452, is connected in the wire 410. In contrast to the power amplifier 200 according to FIG. 3, a reversing switch device 460 is not connected between the first and third wires, but instead between the second wire 411 and the third wire 412. The reversing switch device 460 has two electromechanical switch elements 470 and 475 in the form of relays similar to the reversing switch device 280 shown in FIG. 3. The relay 470 has, in turn, two switch contacts 471 and 472, wherein the switch contact 471 is connected to the wire 411, while the switch contact 472 is connected to the wire 412. In a similar way, the relay 475 has two switch contacts 476 and 477. The switch contact 476 is connected to the wire 411, while the switch contact 477 is connected to the wire 412. The reversing switch device 460 further has wire sections 480, 481, 482, and 483, to which the switch contacts of the relays 470 and 475 can be applied, in order to allow a change of the current flow from the wire 411 to the wire 412 and vice versa, a flow of the current through the wires 411 and 412, and also a blocking of the current flow through the wires 411 and 412. This function was already explained in detail with reference to the power amplifier 200. The switch contacts 471 and 472 of the relay 470 and the switch contacts 476 and 477 of the relay 475 can be driven, in turn, in opposite senses, so that the reversing switch device 460 can mechanically break the current flow through the wires 411 and 412 with the position of the switch contacts shown in FIG. 4. On the output side, a voltage detector 490, by means of which the output voltages on the wires 410, 411, and 412 can be measured, can be connected to the wires 410, 411, and 412. For this purpose, resistors 491 and 494 form a voltage divider which is connected to the wire 410, resistors 492 and 495 form a voltage divider which is connected to the wire 411, and resistors 493 and 496 form a voltage divider which is connected to the wire 412. A current detector (not shown) which can measure the current in each wire can be connected in each wire 410, 411, and 412. The measured voltage and current values can be fed to a process control device and a monitoring device 405. Furthermore, the process control device and/or monitoring device 405 are connected to the switch contacts 431, 432, 451, 452, 471, 476, 472, 477 and the semiconductor switches 440 and 445. The switch contacts and semiconductor switches can be driven according to a programmable process control or as a response to a measured voltage and/or current value, which indicates an error in the power amplifier 400. Likewise, the process control device and/or monitoring device 405 can monitor the running direction of a connected three-phase-current motor.

When a connected three-phase-current motor is to be operated only in one running direction, a reversing switch device can be eliminated. A corresponding power amplifier is shown schematically in FIG. 5. The three-phase power amplifier 500 has, in turn, three wires 510, 511, and 512. So that the power amplifier 500 can also fulfill the requirements of safety category 3, at least one switch contact 520, 531, and 532 is connected in each wire. To be able to allow safe three-phase deactivation of the power amplifier 500, at least two contacts can be driven independently of each other. In the present example, the switch contacts 531 and 532 are part of an electromechanical switch element 530, which is connected to the wires 511 and 512. The switch contact 520 connected to the wire 510 is a component of a separate switch element. Consequently, the switch contact 520 can be driven separately and independently of the switch contacts 531 and 532. To be able to guarantee a safe three-phase deactivation of the power amplifier 500 also for the failure of a switch contact, two switch stages are provided in each wire. The first switch stage contains the switch contacts 520, 531, and 532. The second switch stage has a switch contact 540 in the wire 512, a switch contact 551 in the wire 510, and a switch contact 552 in the wire 511. Semiconductor switches 560 and 570, which are preferably again constructed from triacs, are connected parallel to the switch contacts 551 and 552. Preferably, the switch contacts 551 and 552 belong to a relay.

Figure 5:
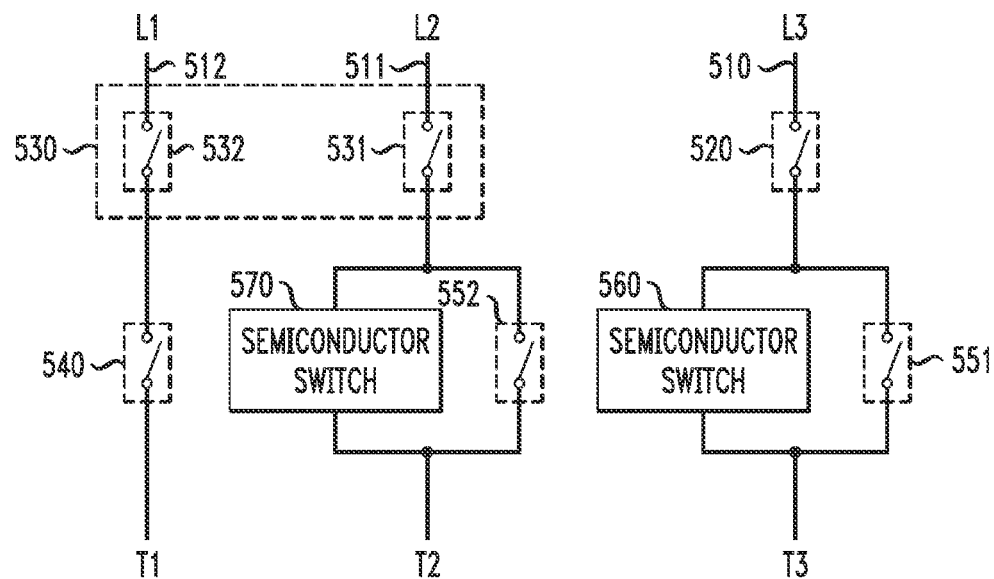
FIG. 5, a schematic representation of a three-phase power amplifier according to the invention without the use of a reversing switch device, FIG. 6, an embodiment of a measurement device according to the invention, FIG. 7, a sampled measurement signal within the permissible measurement range, FIG. 8, a sampled measurement signal lying outside the permissible measurement range, FIG. 9, a simplified block circuit diagram of a two-channel symmetric safety device according to the state of the art, FIG. 10, a simplified block circuit diagram of a safety device for multiple-channel control of a safety-related device according to a first embodiment according to the invention, FIG. 11, the time profile of the monitoring signal, which the first microprocessor-controlled control device of the safety device shown in FIG. 10 generates, FIG. 12, the principle circuit design of the second control device shown in FIG. 10, FIG. 13, an alternative safety device for multiple-channel control of a safety-related device according to the invention, FIG. 14, the principle circuit design of the second control device shown in FIG. 13, FIGS. 15a to 15i, various signal profiles within the circuit arrangement shown in FIG. 14 at predetermined points during fault-free operation, FIGS. 16a to 16i, various signal profiles within the circuit arrangement shown in FIG. 14 at predetermined points during faulty operation, and FIGS. 17a to 17i, various signal profiles within the circuit arrangement shown in FIG. 14 at predetermined points during faulty operation.

The power amplifiers shown in FIGS. 3, 4, and 5 are distinguished by a high degree of robustness against interference and by low thermal and electrical losses in the semiconductor switches thanks to the use of electromechanical switch elements.

The function of the three-phase power amplifier is explained below in more detail in connection with the variant shown in FIG. 4.

Initially, the energizing phase of the power amplifier will be described. In the first step, the two switch contacts 451 and 452 of the relay 450 are closed by means of the process control device and monitoring device 405. Consequently, there is a closed current path via the wire 410. According to which running direction a connected three-phase-current motor is to be Operated, either the switch contacts 471 and 472 of the relay 470 are energized, in order to achieve counterclockwise running, or the switch contacts 476 and 477 of the relay 475 are connected, in order to achieve clockwise running of the three-phase-current motor. If the switch contacts 471 and 472 are connected toward the inside, then the alternating current fed into the wire 411 is guided via the switch contact 471, the wire section 481, and the switch contact 477 to the wire connection T3 of the wire 412, while an alternating current fed into the wire 412 is guided via the switch contact 472, the wire section 482, and the switch contact 476 to the wire connection T2 of the wire 411. In contrast, if the switch contacts 476 and 477 are driven, then there is no current exchange between the wires 411 and 412.

After approximately 20 ms, the semiconductor switches 440 and 445 are triggered by means of a not-shown power supply device. For example, the semiconductor switches 440 and 445 can be supplied with triggering power via the transformer 270 shown in FIG. 3. After another 20 ms, the switch contacts 431 and 432 of the relay 430 are closed. It should be noted that the specified time spans are to be understood only as examples. Preferably, the time periods are even shorter. It is likewise conceivable to close the switch contacts 431 and 432 simultaneously with the triggering of the triacs 440 and 445.

For the present case, it should be assumed that the switch contacts 476 and 477 of the relay 475 have been connected toward the outside, so that fed-through wires 411 and 412 are now provided. Since the switch contacts 431 and 432 have been closed, the triggering power from the semiconductor switch elements 440 and 445 can be deactivated again. Because the semiconductor switches 440 and 445 must switch a simple alternating current only for a short time span, preferably less than 20 ms, economical semiconductors can be used accordingly for realizing the triacs. For this reason, protective circuitry of the triacs 440 and 445 can also be eliminated.

Now the proper deactivation of the power amplifier 400 will be described. Initially, the semiconductor switches 440 and 445 are triggered again and then the switch contacts 431 and 432 of the relay 430 are opened. The current now flows for a short term, usually less than 20 ms, via the semiconductor switch elements 440 and 445. After approximately 20 ms, the triggering power from the semiconductor switches 440 and 445 is disconnected, whereby the driving of a connected three-phase-current motor is deactivated. After another 20 ms, for example, the switch contacts 451 and 452 are opened and the switch contacts 476 and 477 of the reversing circuit 460 are connected toward the inside again, so that now they are connected again to ends of the wire sections 482 and 481, respectively. The reversing switch device 460 is consequently again in the off state. All of the three wires of the three-phase power amplifier 400 are now opened and a safe deactivation state is reached.

During operation, the currents in the wires 410, 411, and 412, and also the output voltages applied to the wires are monitored by the process control device and monitoring device. As soon as the process control device and monitoring device 405 recognize an error case, for example, the switch contacts 451 and 452 in the wire 410 and also, for example, the switch contacts 476 and 475 and the switch contacts 471 and 472 are set into the switch state shown in FIG. 3, so that a three-phase mechanical deactivation can be performed safely.

The function and driving of the switch contacts of the three-phase power amplifier 200 shown in FIG. 3 correspond essentially to the function and switching of the power amplifier 400 described above and shown in FIG. 4. The power amplifier shown in FIG. 3 is distinguished, relative to the power amplifier 400 shown in FIG. 4, in that a three-phase deactivation of the power amplifier can be performed even if the relay 230 is left out, because at least one switch in the form of a mechanical switch contact or a semiconductor switch is provided in each wire.

Measurement Device

Figure 6:
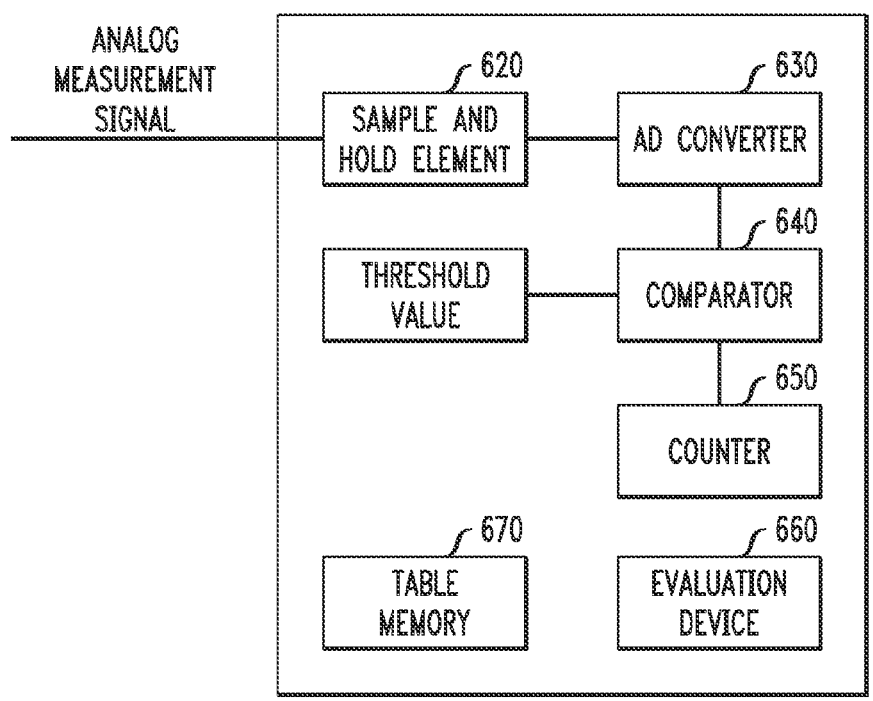

FIG. 6 shows the example measurement device 610, which is suitable, for example, for measuring sinusoidal currents. The measurement device 610 is not used only to measure nominal currents, i.e., currents within a predetermined and reliable operating range. It is also used to determine a value for the actual peak value of the overcurrent if an overcurrent occurs which lies outside the permissible operating range of the measurement device 610. The measurement device 610 and its components, especially a current transformer, can be dimensioned with respect to the maximum nominal current of a motor and thus can be made considerably smaller and more economically than measurement devices that also can measure overcurrents, which can equal seven times the nominal motor current.

Figure 7:
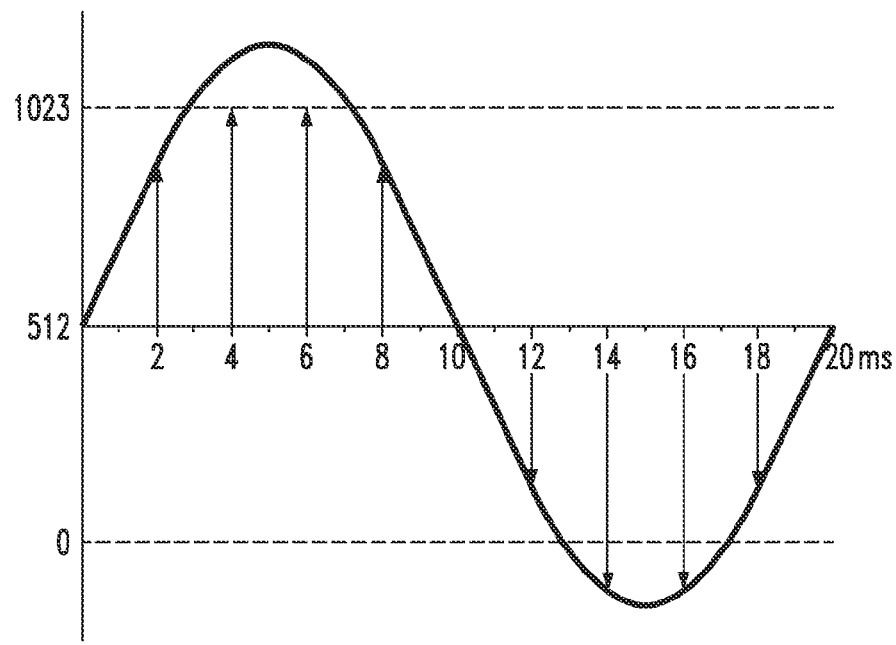

For this purpose, the input side the measurement device 610 can have a sample and hold element 620, to which can be applied the periodic analog signal, which is to be measured and which is tapped, for example, from the wire L1 of the safety switching device 900. The sample and hold element 620 samples an analog signal to be measured at a predetermined sampling rate, which can be adjustable. The output of the sample and hold element 620, to which analog samples of the analog signal to be measured are applied, is fed to an AD converter 630, which converts the samples into the associated digital words. For example, the AD converter 630 can generate digital values with the length of 610 bits from the applied sampled values. For such a 10-bit AD converter, the analog samples are each converted into a sequence of 10 bits, which in turn can be converted into a corresponding decimal number lying between 0 and 1023. Here, for example, the decimal value 0 corresponds to the smallest current value and the decimal count value 1023 corresponds to the largest current value within the permissible operating range, as long as the zero line of a sinusoidal signal is allocated to the decimal count value 512. Such a case is shown in FIG. 7.

Figure 8:
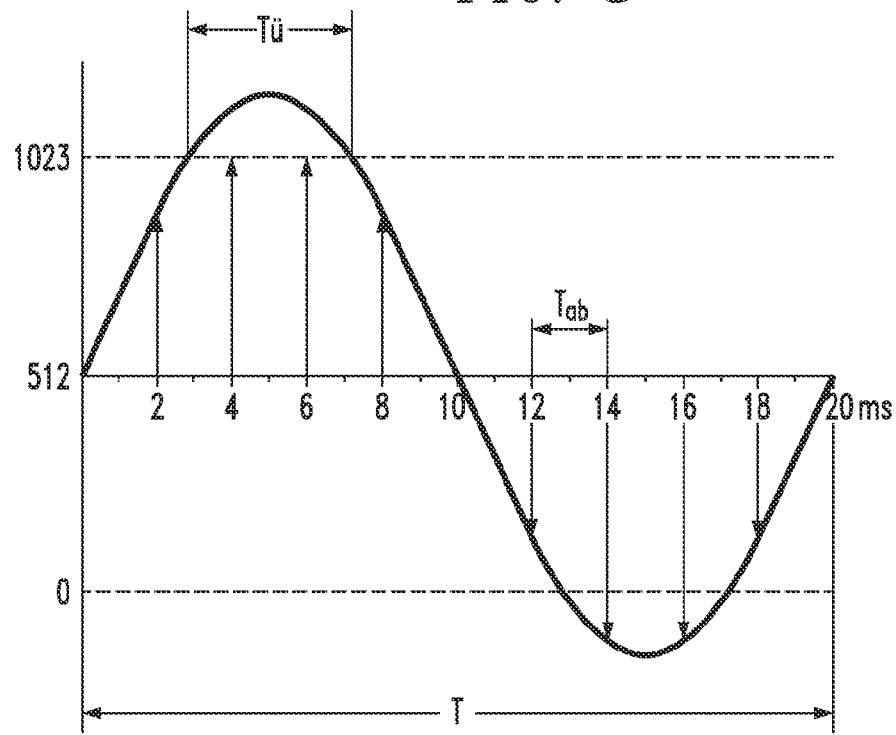

The output of the AD converter 630 is connected to the input of a comparator 640, in which, for example, the decimal count values formed in the AD converter 630 for the samples of a measurement signal are compared to a threshold. In the present case it should be assumed that the threshold coincides with the upper and/or lower limiting value of the permissible operating range of the measurement device 610, i.e., the decimal value 1023 and/or the decimal value 0, as shown in FIGS. 7 and 8 by the dashed lines. The output of the comparator 640 is connected to a counter 650, which counts how many successive count values correspond to the threshold 1023 and/or 0. An evaluation device 660 is connected to the output of the counter 650. As will be described in more detail below, the evaluation device 660 is used to determine the maximum amplitude value, i.e., the peak value of the analog signal to be measured, which is located outside the operating range of the measurement device 610.

According to an alternative embodiment, the corresponding values necessary for determining the maximum amplitude were previously stored in a table memory 670, which can be accessed by the evaluation device 660.

The function of the measurement device 610 shown in FIG. 6 is described in more detail below with reference to two embodiments.

Initially, we will consider FIG. 7. In FIG. 7, an alternating current to be measured with a period of 20 ms is shown, which is sampled in the sample and hold element 620 at a sampling rate of 50 kHz (f=½ ms). The samples are shown as arrows with a spacing of 2 ms in FIG. 7. It should be noted that the measurement current is located within the permissible measurement range of the measurement device 610. The permissible upper and lower limits of the measurement or operating range are shown with dashed lines and allocated to the two decimal values 0 and 1023. As long as the signal to be measured lies within this measurement range, the measurement device 610 operates in the conventional measurement mode.

If the measurement signal exceeds the permissible measurement range, as shown in FIG. 8, then the AD converter 630, which is dimensioned only for the permissible operating range, can no longer resolve the signal correctly and goes into overflow. This has the result that the samples lying outside the permissible measurement range are all represented by the maximum and minimum count values, i.e., 1023 and 0, respectively. At this time, the measurement device 610 transitions into a second mode, in which the peak value of the measurement current lying outside the permissible operating range is determined. Two variants for determining the peak value are described below.

The measurement signal involves a sinusoidal input parameter, which can be described in a known way by the equation $$i(t) = I^* \sin(\acute{u}t) \quad (1)$$

where I is the amplitude of the measurement signal. The amplitude is given by the equation $$I = \frac{i(t)}{\sin(\omega t)}. \quad (2)$$

If the period of the measurement signal and the period $T_{ü}$, which is also called the overcurrent period below and which specifies how long the measurement signal exceeds the permissible measurement range, are known, then the maximum amplitude can be calculated by the equation $$I = \frac{1}{\sin\left(\pi\left(\frac{1}{2} - \frac{T_{ü} * N}{T}\right)\right)} \quad (3)$$

where
i(t)=1 for the nominal range,
$\acute{u}=2\breve{o}/T$, and T is the period of the measurement signal,
$t=T/4-T_{ü}/2$, and $T_{ü}$ is the overcurrent period.

The so-called overcurrent period $T_{ü}$, however, cannot be measured directly.

It can be calculated, however, for example, from the number of sampled values that are greater than or equal to a given threshold in terms of magnitude. In the present example, it is assumed that the threshold matches the count value 1023, which represents the upper limiting value of the permissible measurement range. Furthermore, if the sampling rate $1/T_{ab}$ of the sample and hold element 620 is known, then the overcurrent period $T_{ü}$ can be calculated by the equation $$T_{ü} = N^* T_{AB} \quad (4)$$

The more exact the overcurrent time $T_{ü}$ can be determined, i.e., the smaller the sampling interval $T_{AB}$, the more exact the maximum overcurrent amplitude I can be calculated.

If equation (4) is inserted into equation (3), this gives the calculation specification $$I = \frac{1}{\sin\left(\pi\left(\frac{1}{2} - \frac{T_{AB} * N}{T}\right)\right)}, \quad (5)$$

with which the evaluation device 660 can calculate the maximum overcurrent amplitude I of the measurement signal.

We return to FIG. 8 for further description of the function of the measurement device 610.

The actual amplitude of the measurement current applied to the input of the measurement device 610 clearly exceeds the upper and lower limiting values of the permissible measurement range for the overcurrent period $T_{ü}$. The upper limiting value 1023 corresponds in this example also to the threshold, which is required by the comparator 640, in order to determine the sampled values lying outside the permissible measurement range.

In FIG. 8, both the period T of the sinusoidal signal to be measured, which equals 20 ms, and also the time period $T_{AB}$ between two successive sampled values, which equals 2 ms, are shown. In the curve shown in FIG. 8, it follows that the AD converter 30 allocates the maximum count value 1023 to the second and third sampled value due to overflow. The count values allocated to the sampled values are fed to the comparator 640, which compares the count values with the threshold 1023. The comparator 640 determines that two successive sampled values that were sampled after 4 ms and 6 ms have assumed the maximum count value 1023. The comparator 640 then triggers the counter 650 twice, which then forward a count value 2 to the evaluation device 660. Because the evaluation device 660 [knows] the sampling rate of the AD converter 630, namely $1/T_{AB}$, the count value N=2 delivered by the counter, and also the period T of the signal to be measured, it can calculate the maximum amplitude value of the signal to be measured according to equation (5).

To be able to reduce the circuitry-related complexity of the evaluation device 660 and its computing burden, the determined number of counted sampled values and the associated maximum amplitude values are stored in the memory 670 for several reference signals.

The values stored in the memory 670 are determined in advance in that, for example, several reference signals which have the same known frequency are sampled at a fixed sampling rate. Then, for each reference signal, the number of sampled values which have been converted to the threshold 1023 is determined. With the help of equation (5), for each reference signal the maximum amplitude value is finally determined and stored together with the associated number N in the memory 670.

In the enclosed table, the corresponding values for reference signals at a frequency of 50 Hz are recorded as examples, wherein the reference signals have been sampled at a sampling rate of 6.66 kHz.

In the left column, which is designated with N/2, half of the number of measurement values that exceeded the permissible measurement range are recorded. In the middle column, which is designated with I[A], the appropriate maximum amplitude value calculated according to equation (5) is recorded. In the right column of the table, the maximum error in percent is recorded, which exists between the measured amplitude value and the actual amplitude value.

The negative sign indicates that the actual maximum amplitude value of the signal to be measured is always less than the maximum amplitude value calculated according to equation (5).

This fact is advantageous in electrical drives which must be safely moved into a standstill state when the permissible nominal current is exceeded by a predetermined amount.

At this point it should be mentioned that the values shown in the table up to N/2=30 are of practical significance, because, e.g., asynchronous motors can receive, in principle, only seven times their nominal current. This means that when the counter 650 has counted more than 62 successive sampled values with the count value 1023, the monitored asynchronous motor is deactivated, because the maximum amplitude value of 9.1129 determined by the measurement device 610 corresponds to more than seven times the nominal value of the asynchronous motor. It should be noted that a current corresponding to seven times the nominal value points to a short circuit in the motor.

Thanks to the invention, it is possible to estimate the amplitude of an alternating signal, whose curve is known, outside the permissible operating range with the help of a measurement device which is dimensioned for measuring signals only within the permissible measurement range.

| N/2 | I[A] | max. eror (%) (A) |
|---|---|---|
| 0 | <1,0000 | Nominal range (B) |
| 1 | 1,0011 | −0,1110 |
| 2 | 1,0045 | −0,1110 |
| 3 | 1,0101 | −0,3331 |
| 4 | 1,0180 | −0,5562 |
| 5 | 1,0284 | −0,7814 |
| 6 | 1,0413 | −1,0096 |

-continued

| N/2 | I[A] | max. eror (%) (A) |
|---|---|---|
| 7 | 1,0570 | −1,2419 |
| 8 | 1,0755 | −1,4795 |
| 9 | 1,0972 | −1,7238 |
| 10 | 1,1223 | −1,9760 |
| 11 | 1,1512 | −2,2379 |
| 12 | 1,1844 | −2,5112 |
| 13 | 1,2223 | −2,7979 |
| 14 | 1,2656 | −3,1004 |
| 15 | 1,3151 | −3,4217 |
| 16 | 1,3718 | −3,7649 |
| 17 | 1,4370 | −4,1342 |
| 18 | 1,5121 | −4,5346 |
| 19 | 1,5994 | −4,9720 |
| 20 | 1,7013 | −5,4541 |
| 21 | 1,8214 | −5,9908 |
| 22 | 1,9645 | −6,5946 |
| 23 | 2,1371 | −7,2822 |
| 24 | 2,3486 | −8,0762 |
| 25 | 2,6131 | −9,0078 |
| 26 | 2,9521 | −10,1216 |
| 27 | 3,4009 | −11,4835 |
| 28 | 4,0211 | −13,1953 |
| 29 | 4,9313 | −15,4232 |
| 30 | 6,3925 | −18,4577 |
| 31 | 9,1129 | −22,8578 |

Figure 9:
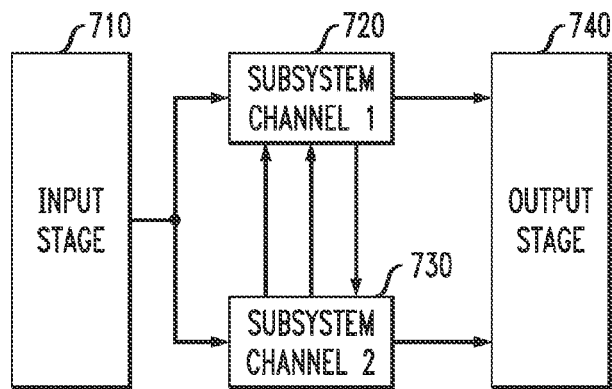

[Note: commas in the table are to be read as decimal points]
Key to previous page:
A Max. Error (%)
B Nominal range Safety Device FIG. 9 shows schematically the construction of a known system for microprocessor-controlled monitoring of a safety-related device (not shown). The system has an input stage 710 that applies a binary process signal or sensor signal as an input signal to two subsystems 720 and 730 operating independently of each other. Each subsystem can have a microprocessor and a separate power supply device. Each subsystem is connected on the output side to an output stage 740, which has, for example, a contactor or an arrangement made from switching devices. By means of the output stage 740, a safety-related application not shown in more detail can be moved into a defined safe state. As shown in FIG. 9, both subsystems 720 and 730 are constructed so that they can monitor the functionality of the other subsystem. The mutual monitoring of the subsystems is usually performed by a bidirectional exchange of status data, as indicated by the arrows in FIG. 9. Each subsystem forms a separate control channel by means of which the output stage 740 can be driven separately. Consequently, each channel, that is, each subsystem, can set the output stage 740 into a state defined as safe independently of the other subsystem.

Figure 10:
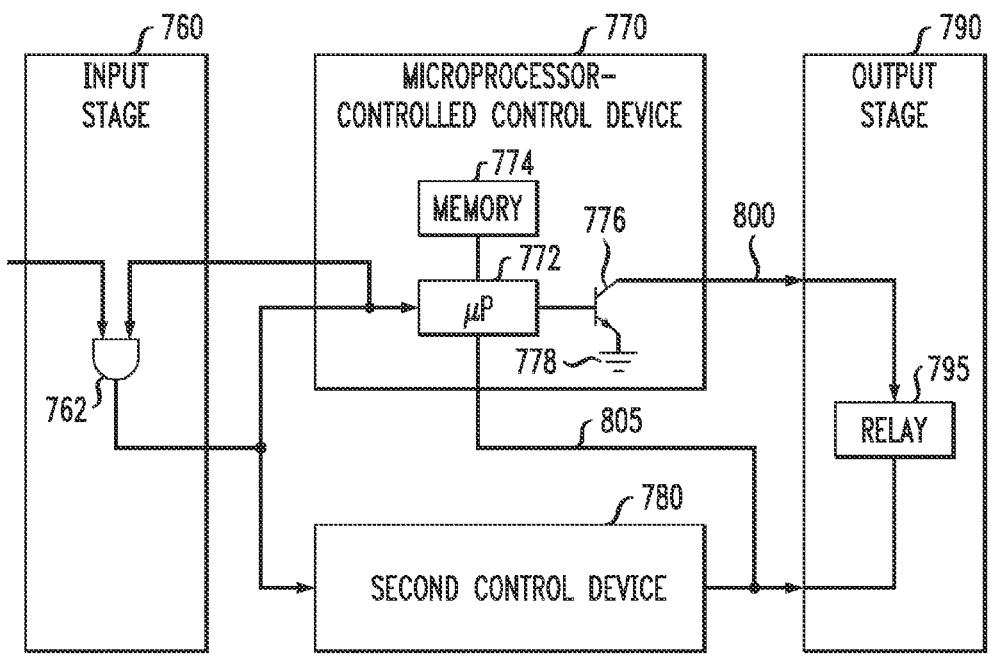

The example multiple-channel safety device for controlling safety-related devices is shown in FIG. 10. At this point it should be noted that the term safety-related device can be understood as an automation system, individual modules of the automation system, and/or safety-related applications in the form of software.

Similar to the arrangement shown in FIG. 9, the safety device 750 shown in FIG. 10 has an input stage 760, a first microprocessor-controlled control device 770 and a second control device 780. Each output of the two control devices 770 and 780 is connected to one input of an output stage 790. The output stage 790 has, for example, a relay 795.

Figure 11:
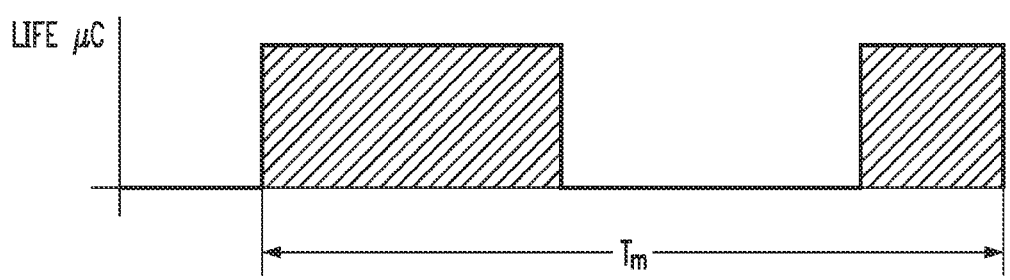

One speaks of a multiple-channel control device 750, because the first microprocessor-controlled control device 770 and the second control device 780 each form a separate control channel for independent control of the relay 795. The first microprocessor-controlled control device 770 contains a memory-programmed microprocessor 772 and a memory 774, in which the control software is stored, which can be accessed by the microprocessor 772. Furthermore, the microprocessor-controlled control device 770 contains a switch 776 constructed, for example, as an NPN bipolar transistor, also called switching transistor below, by means of which the relay 795 can be connected to a ground connection 778. A ground path is defined via the ground connection 778, the switching transistor 776, and a connection line 800, which connects the output of the microprocessor-controlled control device 770 to the input of the output stage 790 and thus to the input of the relay 795. According to the operating state, the microprocessor 772 can open or close the ground path by means of the switching transistor 776. The microprocessor 772 is constructed such that it can generate a monitoring signal, also called life signal below, whose time profile is shown in FIG. 11.

The microprocessor 772 preferably executes safety-related programs with the signal delivered by the input stage, so that if a fault occurs, the safety-related device can be moved reliably into a safe state by means of the output stage 790. Fault sources can be, for example, the microprocessor 772 itself, the input stage 760, or the safety-related device. The monitoring signal generated by the microprocessor 772 reflects the proper or incorrect operation of the microprocessor-controlled control device 770.

The monitoring signal is generated, for example, in that the microprocessor 772 generates a high level when the microprocessor begins with the execution of a safety-related program. As soon as the microprocessor 772 ends the execution of the safety-related program, it generates a low level. In FIG. 11, the profile of the monitoring signal in the defective state of the control device 770 is shown. The period $T_m$ shown in FIG. 11 corresponds, for example, to the time period of a monostable multivibrator implemented in the control device 780, after whose expiration the monostable multivibrator flips back to its stable state. Such a monostable multivibrator is shown as monostable multivibrator 784 in FIG. 12. The time period $T_m$ is also designated below as the monostable time. The function of the control device 800 is described in more detail below.

The life signal generated by the microprocessor 772 is applied to an input of the input stage 760 by means of an output of the microprocessor-controlled control device 770. The binary process signal is present at another input of the input stage 760. The process signal and the life signal are fed, for example, on the input side to an AND gate 762. The AND gate 762 links or modulates both signals and delivers a so-called modulated input signal for the control devices 770 and 780 at its output. Alternatively, instead of a logical AND gate, any other suitable logic operation device or a mechanical switch can be used as a modulation device. In the safety device 750 shown in FIG. 10, the decisive factor is that the process signal modulated with the monitoring signal, and not the process signal coming via the input stage 760, is applied directly to the input of the microprocessor-controlled control device 770 and the control device 780.

It is to be further noted that the control device 780 can drive the output stage 790 independently of the microprocessor-controlled control device 770. For this purpose, a power supply voltage $V_{cc}$ is provided, for example, which can be applied to the relay 795 of the output stage 790 via a transistor 782 acting as a switch. At this point, it should be noted that in the conductive state of the switching transistors 778 and 782, a current flows through the relay 785.

Figure 12:
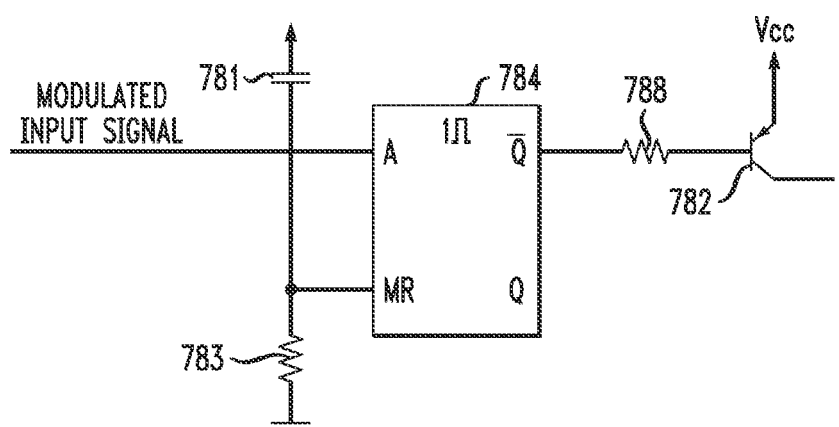

As shown in FIG. 12, the control device 780 has, in addition to the switching transistor 782, the monostable multivibrator 784, which has a negative output designated with $\overline{Q}$, which is preferably connected via a resistor 788 to the control electrode of the switching transistor 782. Furthermore, the monostable multivibrator 784 has an input A, to which the modulated input signal coming from the input stage 760 is applied. Furthermore, a series circuit made from a capacitor 781 and a resistor 783 is provided, by means of which a predetermined voltage potential is applied to a master-reset input designated with MR when the safety device 750 is activated, which has the effect that the monostable multivibrator generates a high level on the Q output.

So that the microprocessor-controlled control device 770 acting as the master can recognize faults in the input stage 760 and in the control device 780, the output of the AND gate 762 of the input stage 760 and the output of the control device 780 are each connected to an input of the microprocessor-controlled control device 770. Because the input parameters and the transfer function of the control device 780 of the microprocessor-controlled control device 770 are known, proper operation of the input stage 760 and the control device 780 can be verified by the fed-back output signals. The reference parameters of the input parameters and the transfer function of the control device 780 can be stored in the memory 774 of the control device 770. If a fault occurs, then both the control device 780 and also the microprocessor-controlled control device 770 can change the output stage 790 into a safe state, in that either the ground path formed via the switching transistor 776 and the connection line 800 is opened and/or the power supply voltage is deactivated by means of the switching transistor 782 of the control device 780 by the relay 795 of the output stage 790.

In the realization of the asymmetric, two-channel safety device 750 shown in FIG. 10, a critical aspect is to be seen in that a defective, uncontrolled oscillation of the life signal can occur, which can prevent safe deactivation of a safety-related device.

Figure 13:
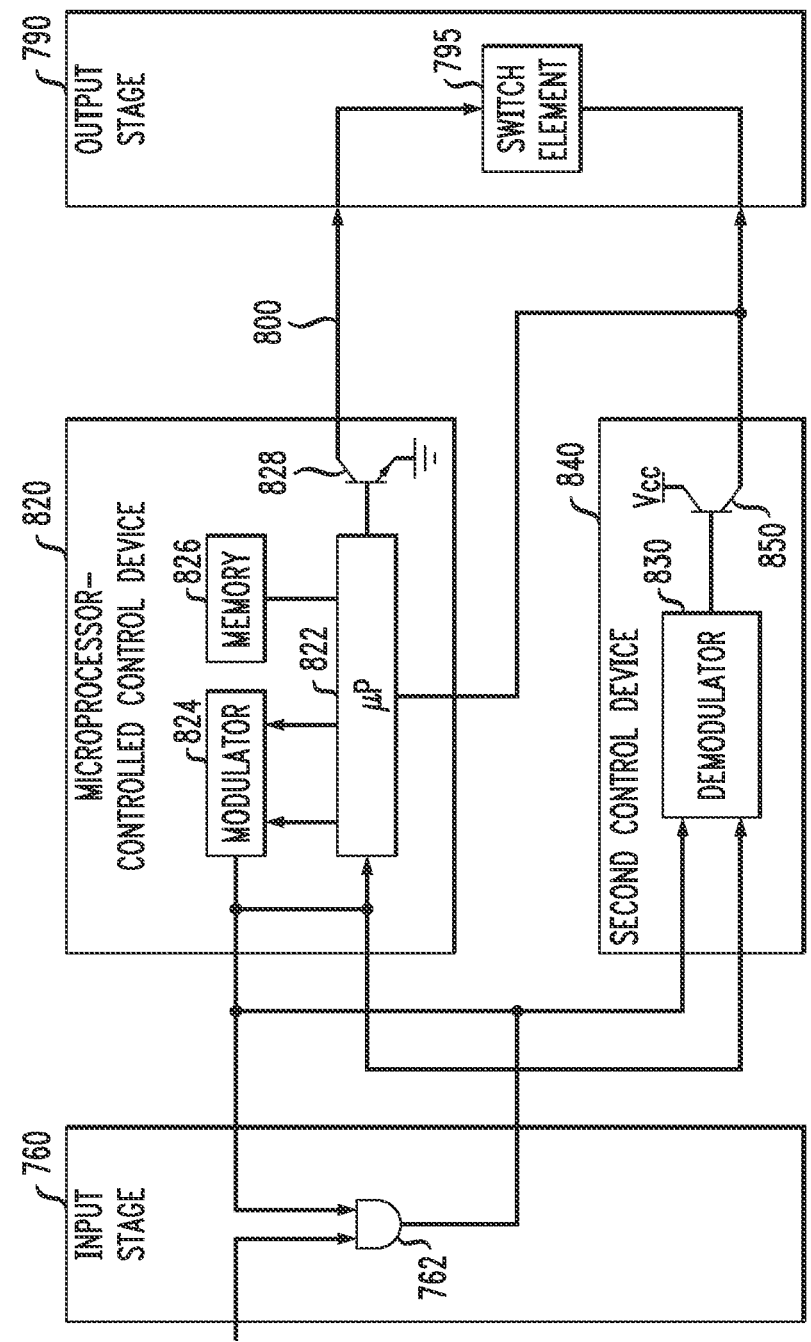

A safety device for solving this problem is shown in FIG. 13. The example safety device 810 used in the safety switching device 900 shown in FIG. 1 has, similar to the safety device 750 shown in FIG. 10, an input stage 760, which can have, in turn, a logic operation device, for example, an AND gate 762. The input signal, which can be the process signal, is applied to one input of the AND gate 762. In turn, one output stage 790 is provided, which can have several interacting switch elements 795 allowing a defined deactivation of the safety-related device. The safety device 810 is constructed, in turn, with multiple channels, in the present example with two channels, wherein a first microprocessor-controlled control device 820 acts as the master and a second control device 840 acts as a slave. In turn, the control device 820 can be viewed as a software-based subsystem, while the control device 840 can be constructed as a hardware-based subsystem, which is shown in more detail in FIG. 14.

The microprocessor-controlled control device 820 has, in turn, a microprocessor 822, which can generate a low-frequency monitoring or life signal. In turn, the microprocessor 822 can generate a rising flank at the beginning of the execution of a safety-related program and can generate a falling flank at the end of the execution of the safety-related program. The time interval of successive pulses, that is, the periodicity of the monitoring signal, is defined, in turn, by the monostable time $T_m$ of a monostable multivibrator. In contrast to the safety device 750 according to FIG. 10, the monitoring signal generated by the microprocessor 822 is fed to a modulator 824, which modulates the low-frequency monitoring signal with a high-frequency modulation signal, which can be, for example, the clock signal of the microprocessor 822, a signal derived from the clock signal, or another high-frequency signal. In this case, the clock signal of the microprocessor 822 is applied to a second input of the modulator 824. The monitoring signal generated by the modulator 824 is fed to another input of the AND gate 762 of the input stage and to a first input of the control device 830. At the output of the AND gate 762 appears a modulated process signal, which is modulated by the modulated monitoring signal delivered by the microprocessor-controlled control device 820. The modulated output signal of the AND gate 762 is applied as a modulated input signal to an input of the microprocessor-controlled control device 820 and to another input of the control device 840. The microprocessor 822 is in turn in the position to monitor the output signal coming from the AND gate 762 with respect to a fault. Input parameters, which relate to the input stage 760, as well as the transfer function of the control device 830, can be stored in a memory 826. The microprocessor 822 is connected to the control electrode, in the present example connected to the base of a switching transistor 828, which can connect the output stage 790 to ground via a connection line 800. The switching transistor 828 can be constructed, for example, as a bipolar transistor of NPN type. For example, the emitter electrode of the switching transistor 828 is connected to ground and the control electrode of the switching transistor 828 is connected to the input of the output stage 790. If the microprocessor 822 recognizes a fault, then it can separate the ground path formed via the switching transistor 828 and the connection line 100, in that it applies a low level to the control electrode of the switching transistor 828, so that the switching transistor is blocked.

Figure 14:
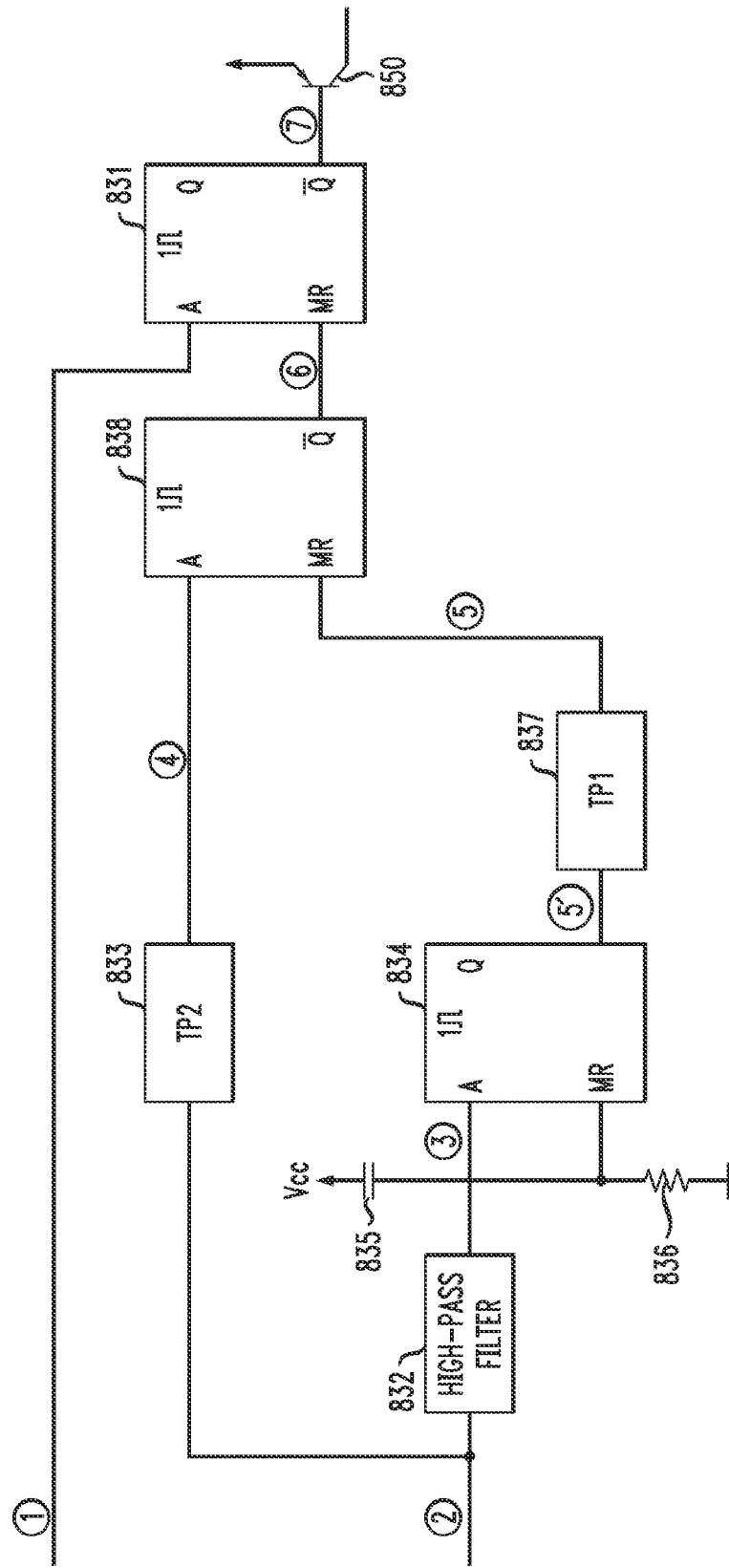

The output signal of the control device 840 is connected on the input side to the microprocessor-controlled control device 820. The microprocessor 822 is implemented, in turn, such that it can recognize faulty behavior of the control device 830 under consideration of the stored transfer function of the control device 840. The control device 830 has a demodulator 840, which is shown in FIG. 14 in more detail.

The output of the demodulator 830 can be connected to the control electrode of a switching transistor 850, by means of which a power supply voltage can be applied to the output stage 790. The demodulator 830 has a monostable multivibrator 831, which corresponds in its function to the monostable multivibrator 784 of the control device 780 shown in FIG. 12. The monostable multivibrator 831 has an input designated with A, to which the modulated input signal coming from the AND gate 762 is applied. The modulated monitoring signal delivered by the modulator 824 is fed to a high-pass filter 832 and a low-pass filter 833 designated with TP2. The output signal of the high-pass filter 832 is fed to another monostable multivibrator 834. The monostable multivibrator 834 has a master-reset input, to which a power supply voltage $V_c$, can be applied via a series circuit, which has a capacitor 835 and a resistor 836. The negated output of the monostable multivibrator 834 is applied to the input of another low-pass filter 837 designated with TP1. The output of the low-pass filter 833 is connected to a first input of a monostable multivibrator 838 designated with A, while the output of the low-pass filter 837 is connected to the master-reset input of the monostable multivibrator 838. The negative output of the monostable multivibrator 838 designated with $\overline{Q}$ is finally connected to the master-reset input of the monostable multivibrator 831. The negative output of the monostable multivibrator 831 designated with $\overline{Q}$ is connected to the control electrode, in the present example to the base of the switching transistor 850.

The curves shown in FIGS. 15a to 15i are input or output signals at predetermined observation points within the demodulator 830, which is characterized with the numbers 1 to 7 accordingly. The voltage profiles take place during proper operation of the safety device 810. For faulty operation of the control device 820, voltage profiles appear that are shown in FIGS. 16a to 16i or 17a to 17i.

The function of the two safety devices 750 and 810 shown in FIGS. 10 and 13, respectively, is described in more detail below. In particular, the function of the control device 780 is described according to FIG. 10 and the function of the control device 840 shown in FIG. 13 is described in more detail.

Initially, the function of the control device 780 shown in FIG. 10 will be explained in more detail in connection with FIGS. 11 and 12.

The case should be assumed that a safety-related automation system, which includes the safety device 750, is to be set in operation. At the beginning, a voltage potential is applied to the master-reset input MR of the monostable multivibrator 784 via the capacitor 781 and the resistor 783, which has the effect that the negative output $\overline{Q}$ of the monostable multivibrator 784 is set to a high level, which sets the switching transistor 782 in the blocked state. This has the effect, in turn, that the power supply voltage $V_{cc}$ is not applied to the output stage 790 via the switching transistor 782. In this way it is guaranteed that the output stage 790 can be set in operation only when a power supply voltage is applied and execution of the self-test has been completed.

After a time defined by the resistance value of the resistor and the capacitance of the capacitor, the voltage potential at the master-reset input of the monostable multivibrator 784 decreases, so that the output $\overline{Q}$ depends on the modulated input signal which is present at the input A and which is delivered by the AND gate 762. It is assumed that a process signal with a high level is present at the AND gate 762 of the input stage 760, so that for proper functioning of the control device 770, the monitoring signal shown in FIG. 11 is present as a modulated input signal at the input A of the monostable multivibrator 784. With the first positive flank of the modulated input signal, the output $\overline{Q}$ of the monostable multivibrator 784 is set to low for the monostable time $T_m$. During this time, the switching transistor 782 is kept conductive. If another positive flank appears in the monitoring signal, as shown in FIG. 11, before the expiration of the monostable time $T_m$, the monostable multivibrator 784 is triggered again and the output $\overline{Q}$ is set to low, in turn, for the monostable time $T_m$. As long as the microprocessor 772 of the microprocessor-controlled control device 770 operates properly, a positive flank is generated before the expiration of the monostable time $T_m$. As long as the automation system, the control devices 770 and 780, and the input stage 760 are operating properly, the switching transistor 782 is kept in the conductive state by means of the monostable multivibrator 784. Proper operation means that the input signal or process signal has a high level at the input of the AND gate 762 of the input stage 760 and the modulated input signal is an alternating signal whose period is less than or equal to the monostable time $T_m$.

Now if a fault occurs in the control device 770 or the input stage 760, the monostable multivibrator 784 ensures that the switching transistor 782 switches into the blocked state and thus the output stage 790 is separated from the power supply voltage $V_{cc}$. A fault can be indicated, for example, also in that a process signal is generated with a low level, which ensures that the output of the AND gate 762 is set to zero. Consequently, the monitoring signal no longer reaches the input A of the monostable multivibrator 784. Because a positive flank no longer appears at the input A of the monostable multivibrator within the monostable time $T_m$, the output Q of the monostable multivibrator 784 is set to zero. This has the result that the switching transistor 782 is blocked and thus the power supply voltage is separated from the output stage 790. The automation system can now be moved into a safe state.

In addition, a fault can occur in the control device 770, if, for example, the microprocessor 772 does not start a safety-related program due to an unforeseeable fault. In this case, the monitoring signal remains continuously, for example, at a low level. This has the result, in turn, that a positive flank does not appear on the input A of the monostable multivibrator 784 over a time span that is longer than the monostable time $T_m$ of the monostable multivibrator 784, so that the switching transistor 782 is set into the blocked state. In a similar way, the monitoring signal remains at a high level when the microprocessor 772 does start a safety-related program, but the program cannot be completed due to an unforeseeable fault. This state leads to the result, in turn, that a positive flank does not appear at the input A of the monostable multivibrator 784 over a time span that is longer than the monostable time $T_m$ of the monostable multivibrator 784, so that the switching transistor 782 is set into the blocked state and the output stage 790 is moved into a safe, predefined state. At this point it should be noted that the monostable multivibrator 784 can also be triggered by falling flanks according to the realization of the control device 780.

Thanks to the asymmetric, two-channel safety device 750, it is possible to move an automation system or its safety-related components into a safe state if a fault appears whose origin is, for example, in the input stage 760 or the safety device 770.

A fault in the control device 780 is recognized by the control device 770, in that the output signal of the control device 780 is guided to the microprocessor 772 via the feedback line 805. The control device 770 knows the transfer function of the control device 780, which can be stored in the memory 774. If the control device 770 recognizes a fault in the output signal of the control device 780, the microprocessor 772 ensures that the switching transistor 776 is blocked and thus the ground path to the output stage 790 is opened.

It should also be noted that the monostable multivibrator 784 is used furthermore for lengthening the activation time of the applied modulated input signal by the monostable time $T_m$, so that the output stage 790 can also be set in a controlled way into a safe state even after the input signal or process signal is deactivated. To be able to maintain the safety conditions necessary for the safe deactivation of an automation system, the monostable time $T_m$ may not be longer than the safety deactivation time of the output stage 90.

The function of the asymmetric, two-channel safety device 810 shown in FIG. 13 is described in more detail below in connection with the FIGS. 14 to 17i.

The demodulator 830 shown in FIG. 14 for the control device 840 has, in contrast to the circuit arrangement shown in FIG. 12, a low-pass filter and a high-pass arrangement, by means of which something like a digital bandstop filter is realized. For the correct dimensioning of the components and proper functioning of the safety device 810, the demodulator 830 acts similar to the monostable multivibrator 784 shown in FIG. 12. However, if a fault occurs in the control device 820, for example, in the microprocessor 822, then according to the error case, the high-frequency and low-frequency portions of the modulated monitoring signal coming from the modulator 824 are shifted to higher or lower frequencies. The result is that either the high-frequency or the low-frequency portion of the modulated monitoring signal is blocked by the bandstop behavior of the demodulator 830. This has the result that the monostable multivibrator 831 sets the positive output Q to low after expiration of the monostable time, which sets the switching transistor 850 into the blocked state and thus the output stage 790 is moved into a safe state. It should also be noted that the control device 820 has a software module, which ensures that a change in the clock of the microprocessor 822 leads to a corresponding frequency shift in the life signal.

The function of the demodulator 830 is described in detail with reference to FIGS. 15 to 17i. First the error-free operation of the control device 820 is described.

In an error-free operation of the safety device 810, the signal profiles shown in FIGS. 15a to 15i appear at the observation points shown in FIG. 14.

We first consider the time period from $T_0$ to $T_1$. It is assumed that no process signal is applied to the AND gate 762 up to time $T_1$, as shown in FIG. 15f. Thus, no signal is present at the input A of the monostable multivibrator 831 up to time $T_1$, as shown in FIG. 15g. FIG. 15a schematically shows the modulated monitoring signal, which is a superposition of the clock signal of the microprocessor 822 and the monitoring signal shown in FIG. 11. In the shown curve, which begins at time $T_0$, the period of the monitoring signal coincides approximately with the monostable time $T_m$ of the monostable multivibrator 831. The clock signal of the microprocessor 822 used by the modulator 824 of the control device 820 as a modulation signal has a period of $T_s$, which is likewise recorded in FIG. 15a. At this point it should also be mentioned that the series circuit with the capacitor 835 and the resistor 836 is used to apply a voltage potential to the master-reset input of the monostable multivibrator 834 at the activation time of the automation system, which ensures a low level on the negated output $\overline{Q}$ of the monostable multivibrator 834 at time $T_0$, as shown in FIG. 15i.

FIG. 15b shows the low-frequency portion of the modulated monitoring signal, which is present at the output of the low-pass filter 833. FIG. 15c shows the high-frequency portion of the modulated monitoring signal, which is present at the output of the high-pass filter 832. FIG. 15i shows the signal profile present at the negated output $\overline{Q}$ of the monostable multivibrator 834. This signal goes to zero at time $T_0$ when the modulated input signal according to FIG. 15a is applied to the high-pass filter 832, because positive flanks of the high-frequency signal portion shown in FIG. 15c trigger this response before expiration of the special monostable time of the monostable multivibrator 834. FIG. 15d shows the signal profile present at the output of the low-pass filter 837. This signal profile assumes the value of the signal profile according to FIG. 15i, i.e., zero, after a predetermined runtime. FIG. 15e shows the signal profile present at the negated output $\overline{Q}$ of the monostable multivibrator 838. FIG. 15h shows the signal profile at the output Q of the monostable multivibrator 831.

A process signal, which can also be a sensor signal, is applied at time $T_1$ with a high level to the AND gate 762, as shown in FIG. 15f. From this time on, the AND gate 762 delivers the alternating signal shown in FIG. 15g. This signal no longer contains high-frequency portions in the present example due to system-dependent low-pass characteristics. Instead, it corresponds to the monitoring signal with a period of less than or equal to $T_m$.

In proper operation, because a low level, which is simultaneously present at the master-reset input of the monostable multivibrator 831, is present at the negated output $\overline{Q}$ of the monostable multivibrator 838 according to FIG. 15e, its behavior is determined by the modulated input signal according to FIG. 15g. Because the period of the modulated input signal, as stated, is less than the monostable time $T_m$ of the monostable multivibrator 831, the monostable multivibrator 831 is triggered correctly. Consequently, the output $\overline{Q}$ of the monostable multivibrator 831 delivers a high level, as shown in FIG. 15h. This has the result, in turn, that the switching transistor 850 is kept in the conductive state and the output stage is provided with power.

Now the fault case is assumed, such that the frequency of the clock of the microprocessor 822 decreases at time $T_2$. This is shown in FIG. 16a for the modulated monitoring signal, which is applied to the input of the high-pass filter 832 and to the input of the low-pass filter 833. As is visible, the time interval of the clock pulses is longer after time $T_2$. Consequently, a lengthening of the period of the clock signal of the microprocessor 822 follows a lengthening of the period of the monitoring signal. These circumstances are shown in FIG. 16a. FIG. 16f shows that a process signal with a high level is still present at the AND gate 762, which represents the normal operating state of the system. FIG. 16b shows the change in the output signal at the low-pass filter 833 after the time $T_2$, since the frequency of the clock signal of the microprocessor 822 is reduced.

FIG. 16c shows the change in the clock signal of the microprocessor 822 at time $T_2$. Because the time interval of successive positive flanks in the clock signal of the microprocessor 822 at time $T_2$ is longer than the monostable time of the monostable multivibrator 834, the high-frequency clock signal of the microprocessor 822 shown in FIG. 16h appears at the negated output $\overline{Q}$ of the monostable multivibrator 834. The low-pass filter 837 filters the high-frequency portions from the output signal at the negated output $\overline{Q}$ of the monostable multivibrator 834, so that a high level is present at the output of the low-pass filter 837 after expiration of the monostable time of the monostable multivibrator 834, as shown in FIG. 16d. The high level is applied to the master-reset input of the monostable multivibrator 838 and ensures that a high level is generated at the negated output of the monostable multivibrator 838, which is shown in FIG. 16e. Consequently, an output signal at a low level is generated by means of the master-reset input of the monostable multivibrator 831, as shown in FIG. 16g. This signal sets the switching transistor 850 into the blocked state. Consequently, the power supply voltage is separated from the output stage 790, so that the output stage 790 can move a safety-related device into a safe state.

The signal profiles in FIGS. 17a to 17i appear if there is a fault in the control device 820 which manifests itself as an increase of the clock frequency of the microprocessor signal. FIG. 17a shows the modulated monitoring signal which comes to the input of the high-pass filter 832 and to the input of the low-pass filter 833 and which changes as shown at a time $T_3$. It is still assumed that the input stage 760 and the automation system themselves are operating without errors, so that a process signal with a high level is still present at the AND gate 762, as shown in FIG. 17f. FIG. 17i shows the change in the modulated input signal after time $T_3$, which is applied to the input A of the monostable multivibrator 831. FIG. 17c shows, in turn, the change in the clock signal at the output of the low-pass filter 832 at time $T_3$. The high-frequency input signal shown in FIG. 17c has the effect that a low level is continuously present at the negated output of the monostable multivibrator 834, which is shown in FIG. 17h. The low level is applied via the low-pass filter 837 to the master-reset input of the monostable multivibrator 838.

The low-pass filter 833 is dimensioned so that it also blocks the low-frequency portion of the faulty modulated monitoring signal, which is shown in FIG. 17a, starting at time $T_3$, as shown by the voltage profile in FIG. 17b. Because only a constant level is still present at the input A of the monostable multivibrator 838, the negated output is set to a high level after the monostable time of the monostable multivibrator 838 elapses, as shown by FIG. 17e. Now, the monostable multivibrator 831 is reset by means of the master-reset input MR, whereby the output of the monostable multivibrator 831 is set to zero, as shown in FIG. 17g. The switching transistor 850 is blocked, in turn, and thus the voltage power supply is separated from the output stage 790.

The following claims are presented for examination:

1. A safety switching device (900) for setting at least one safety-related device into a safe state, the device comprising:
   a first connection device (910) for connecting the safety switching device to a single-phase or multiple-phase power supply device;
   at least one second connection device (920) for connecting a safety-related device;
   a third connection device (940, 945) for connecting at least one safety-related input stage (760);
   a power amplifier (200) that is single-phase or multiple-phase connected between the first and second connection devices (910, 920) with at least one controllable switch contact;
   a measurement device (610); and
   a safety device (820, 840) for multiple-channel driving of the power amplifier (200);
   wherein the safety device (820, 840) comprises
      a first control device (820), which has a programmable control unit (822) and which has a device for generating a monitoring signal, and
      a second control device (840),
      wherein the input stage (760) is connected to the first control device (820) and to the second control device (840) and is constructed for modulating an input signal with the monitoring signal coming from the first control device (820),
      wherein the first control device (820) and/or the second control device (840) set the safety-related device into a predetermined safe state in response to the modulated input signal, if a fault occurs, and
      wherein the first control device (820) is allocated to the measurement device (610) and is constructed such that it sets the safety-related device into a predetermined safe state via the power amplifier (200) as a response to a measured analog signal, if a predetermined parameter of the measured analog signal lies outside a predetermined operating range.

2. The safety switching device according to claim 1, characterized in that the power amplifier (200) is a three-phase power amplifier and has first, second, and third wires (210, 211, 212; 410, 411, 412; 510, 511, 512), which can be connected to a three-phase-current power supply device via the first connection device (910), wherein at least one controllable switch contact (231, 232, 242; 451, 431, 432; 520, 531, 532) is allocated to each wire for opening and closing each wire, wherein at least two of the switch contacts are driven independently of each other.

3. The safety switching device according to claim 1, characterized in that the measured analog signal corresponds to a periodic wire current and in that the measurement device (610) has a device (620, 630, 640, 650) for determining the time period during which the amplitude of the analog wire current to be measured lies outside the predetermined operating range, and an evaluation device (660) that calculates the maximum amplitude of the wire current from the determined

31 time period and the signal form, especially the signal frequency of the wire current to be measured.

4. The safety switching device according to claim 3, characterized in that a second measured analog signal corresponds to a wire voltage and in that the measurement device (610) contains a device for determining the effective power.

5. The safety switching device according to claim 1, characterized in that the input stage (760) has at least one safety-related and/or application-dependent switch device (765).

6. The safety switching device according to claim 1, characterized in that the microprocessor (822) generates the monitoring signal as a function of the processing of at least one safety-related program.

7. The safety switching device according to claim 1, characterized in that the first control device (820) has a device for monitoring the input stage (760) and/or the second control device and for generating an error signal, and in that the first control device (820) sets the safety-related device into a predetermined safe state as a response to the error signal.

8. The safety switching device according to claim 1, characterized in that the input stage (760) has a logic operation device (762), especially an AND gate, for modulating the input signal with the monitoring signal.

9. The safety switching device according to claim 1, characterized in that the first control device (820) has a modulator (824) for modulating the monitoring signal with a signal whose frequency is higher than the frequency of the monitoring signal, in that the input stage (70) is constructed for modulating the modulated monitoring signal with the input signal, and in that the second control device (840) has a demodulator (830), which generates a control signal that sets the safety-related device into the predetermined safe state when a fault occurs in response to the modulated input signal coming from the input stage (760) and to the modulated monitoring signal coming from the first control device (820).

10. The safety switching device according to claim 9, characterized in that the demodulator (830) has a bandstop filter and at least one switching device (831), especially a monostable multivibrator, which delivers a control signal for setting the safety-related device into the predetermined safe state when the frequency of the signal with a higher frequency changes by a predetermined amount.

11. The safety switching device according to claim 1, characterized in that the input signal is a binary process signal.

12. The safety switching device according to claim 1, characterized in that the first connection device (910), the one or more second connection devices (920), the third connection device (940, 945), the power amplifier (200), the measurement device (610), and the control devices (820, 840) are arranged on a circuit board.

13. A safety device for multiple-channel control of a safety-related device, comprising:
a first microprocessor-controlled control device (770; 820), which has a signal generating device (772; 822) for generating a monitoring signal;
a second control device (800; 840); and
an input stage (760), which is connected to the first microprocessor-controlled device (770; 820) and to the second control device (800; 840) and which is constructed for modulating an input signal with the monitoring signal coming from the first microprocessor-controlled control device (770; 820);
wherein the first microprocessor-controlled control device (770; 820) and/or the second control device (800; 840) set the safety-related device into a predetermined safe state in response to the modulated input signal, if a fault occurs.

32

14. The safety device according to claim 13, characterized in that the signal generating device generates the monitoring signal as a function of the processing of at least one safety-related program by the first microprocessor-controlled control device (770; 820).

15. The safety device according to claim 13, characterized in that the first microprocessor-controlled control device (770; 820) and the second control device (800; 840) are connected to an output stage (790) and each have a device for activating or deactivating the output stage (790).

16. The safety device according to claim 15, characterized in that the activation/deactivation device of the first microprocessor-controlled control device (770; 820) has a switch (776; 828) that can be connected to ground, and that the activation/deactivation device of the second control device (800; 840) has a switch (782; 850) that can be connected to a power supply voltage.

17. The safety device according to claim 15, characterized in that the output stage (790) is at least one switch device (795).

18. The safety device according to claim 13, characterized in that the first microprocessor-controlled control device (770; 820) has a device for monitoring the input stage and/or the second control device and for generating an error signal, and in that the first microprocessor-controlled control device (770; 820) sets the safety-related device into a predetermined safe state as a response to the error signal.

19. The safety device according to claim 13, characterized in that the input stage (760) has a logic operation device (762) for modulating the input signal with the monitoring signal.

20. The safety device according to claim 13, characterized in that the first microprocessor-controlled control device (820) has a modulator (824) for modulating the monitoring signal with a signal, whose frequency is higher than the frequency of the monitoring signal, in that the input stage (760) is constructed for modulating the modulated monitoring signal with the input signal, in that the second control device (840) has a demodulator (830), which generates a control signal that sets the safety-related device into a predetermined safe state if a fault appears in response to the modulated input signal coming from the input stage (760) and to the modulated monitoring signal coming from the first microprocessor-controlled control device (820).

21. The safety device according to claim 20, characterized in that the demodulator (830) has a bandstop filter and at least one switch device (831) which delivers a control signal for setting the safety-related device into the predetermined safe state when the frequency of the signal with a higher frequency changes by a predetermined amount.

22. The safety device according to claim 21, characterized in that the demodulator (830) comprises
a high-pass filter (832) and a first low-pass filter (833), each of whose inputs is connected to the output of the first microprocessor-controlled device (820),
a first monostable multivibrator (834) which has a reset input and a signal input and is connected to the output of the high-pass filter,
a second low-pass filter (837) whose input is connected to the negated output of the first monostable multivibrator (834),
a second monostable multivibrator (838) whose signal input is connected to the output of the first low-pass filter (833) and whose reset input is connected to the second low-pass filter (837), and a third monostable multivibrator (831) whose signal input is connected to the output of the input stage (760) and whose reset input is connected to the negated output of the second monostable multivibrator (838).

23. The safety device according to claim 13, characterized in that the first microprocessor-controlled control device (770; 820) is software-based and the second control device (800; 840) is hardware-based.

24. The safety device according to claim 13, characterized in that the input signal is a binary process signal.

25. The safety device according to claim 13, characterized in that the second control device (800; 840) has a microprocessor.

* * * * *

UNITED STATES PATENT AND TRADEMARK OFFICE
CERTIFICATE OF CORRECTION

PATENT NO.       : 8,363,371 B2                                               Page 1 of 1
APPLICATION NO.  : 11/915326
DATED            : January 29, 2013
INVENTOR(S)      : Andre Korrek It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1283 days.

Signed and Sealed this
First Day of September, 2015

Michelle K. Lee
*Director of the United States Patent and Trademark Office*